(12) United States Patent
Koyanagi

(10) Patent No.: US 7,091,534 B2
(45) Date of Patent: Aug. 15, 2006

(54) SEMICONDUCTOR DEVICE USING LOW DIELECTRIC CONSTANT MATERIAL FILM AND METHOD OF FABRICATING THE SAME

(75) Inventor: Mitsumasa Koyanagi, Natori (JP)

(73) Assignee: ZyCube Co., Ltd., Tokyo (JP)

( * ) Notice: Subject to any disclaimer, the term of this patent is extended or adjusted under 35 U.S.C. 154(b) by 17 days.

(21) Appl. No.: 10/494,769

(22) PCT Filed: Nov. 5, 2002

(86) PCT No.: PCT/JP02/11494

§ 371 (c)(1),
(2), (4) Date: May 5, 2004

(87) PCT Pub. No.: WO03/041167

PCT Pub. Date: May 15, 2003

(65) Prior Publication Data

US 2004/0266168 A1    Dec. 30, 2004

(30) Foreign Application Priority Data

Nov. 5, 2001    (JP) .............................. 2001-340076

(51) Int. Cl.
*H01L 29/80* (2006.01)
(52) U.S. Cl. ....................... 257/276; 438/214
(58) Field of Classification Search ................. 257/276, 257/508, 621, 691, 785; 438/214, 620
See application file for complete search history.

(56) References Cited

U.S. PATENT DOCUMENTS 6,734,477 B1 *    5/2004    Moise et al. ................. 257/295

FOREIGN PATENT DOCUMENTS

| EP | 0486318 A1 | 5/1992 |
|---|---|---|
| EP | 0570224 A2 | 11/1993 |
| EP | 0703619 A1 | 3/1996 |
| JP | 2001-196374 A2 | 7/2001 |
| WO | WO 99/45588 | 9/1999 |

OTHER PUBLICATIONS

International Search Report, completed Feb. 24, 2003.
Lee, Kang Wook et al, "Development of Three-Dimensional Integration Technology for Highly Parallel Image-Processing Chip", Jpn. J. Appl. Phys. vol. 39 (2000) pp. 2473-2477, Part I, No. 4B, Apr. 2000.
Kurino, H. et al, "Intelligent Image Sensor Chip with Three Dimensional Structure", Dept. of Machine Intelligence and Systems Engineering, Tohoku University, 1999 IEEE, 5 pages.

* cited by examiner

*Primary Examiner*—David Nelms
*Assistant Examiner*—Quoc Hoang
(74) *Attorney, Agent, or Firm*—Griffin & Szipl, P.C.

(57) ABSTRACT

The semiconductor device is capable of coping with speedup of operation using a low dielectric constant material film other than silicon. The base (10) formed by the substrate (11) and the low dielectric constant material film (12) whose relative dielectric constant is lower than silicon is provided. The semiconductor element layer including the MOS transistor (30) is adhered onto the surface of the base (10) for stacking. The transistor (30) is formed by using the island-shaped single-crystal Si film (31) and buried in the insulator films (15), (16) and (17). The multilayer wiring structure (18) is formed on the semiconductor element layer and is electrically connected to the transistor (30). The electrode (20) functioning as a return path for the signals is formed on the back surface of the base (10). Instead of forming the electrode (20) on the base (10), the electrodes (20A) may be arranged on the back surface of the base (10A), configuring the base (10A) as an interposer.

14 Claims, 18 Drawing Sheets

SEMICONDUCTOR DEVICE USING LOW DIELECTRIC CONSTANT MATERIAL FILM AND METHOD OF FABRICATING THE SAME

This is a National Phase Application in the United States of International Patent Application No. PCT/JP02/11494 filed Nov. 5, 2002, which claims priority on Japanese Patent Application No. 2001-340076, filed Nov. 5, 2001. The entire disclosures of the above patent applications are hereby incorporated by reference.

TECHNICAL FIELD

The present invention relates to a semiconductor device and a method of fabricating the same and more particularly, to a semiconductor device using a base including a low dielectric constant material film whose relative dielectric constant is lower than silicon (Si) to raise its operation speed, and a method of fabricating the device.

BACKGROUND ART

Conventionally, as one of the techniques coping with the miniaturization and higher integration of semiconductor elements mounted on a semiconductor device, the SOI (Silicon On Insulator) technique has been known. This technique is a technique for forming a single-crystal silicon film on an insulative substrate, where isolation among semiconductor elements is realizable almost completely. Thus, this technique has advantages that (i) it is easy to cope with the miniaturization and higher integration of semiconductor elements and that (ii) it is easily possible to cope with speedup of operation because parasitic capacitance between the elements and the substrate is lowered.

Moreover, with the recent semiconductor devices, speedup of the operation are progressing along with miniaturization and higher integration of the semiconductor elements and thus, the operating frequency of the elements has entered the order of GHz. Further, because the size itself of the chip of a semiconductor device (i.e., a semiconductor chip) increases with the rising integration level, there is a growing tendency that wiring lines interconnecting semiconductor elements located on the semiconductor chip (i.e., on-chip wiring lines), and the characteristics of the substrate (e.g., wiring resistance and parasitic capacitance of the wiring lines and the substrate) determine the performance of the semiconductor device.

With the recent semiconductor devices, to cope with such the tendency as above, wiring lines are shifting from aluminum (Al) lines to copper (Cu) lines in order to lower their electric resistance. Moreover, to reduce the parasitic resistance to suppress the signal transmission delay, an insulator material film having a lower dielectric constant (e.g., the relative dielectric constant is equal to 3 or lower) is adopted as the interlayer insulator film and at the same time, the wiring structure is shifting from a single-layer wiring to a multilayer wiring structure.

The above-described conventional techniques can cope with the speedup of operation to a certain extent. However, if the operating frequency enters the order of GHz, these conventional techniques are unable to realize it easily. This is because signal transmission delay induced by the parasitic resistance and parasitic capacitance of the single-crystal silicon substrate itself is elicited.

Response to the operating frequency in the order of GHz is realizable if a semiconductor substrate (e.g., a GaAs substrate) other than a single-crystal silicon substrate is used. If so, however, there arises another problem that the fabrication cost is higher, the integration scale is unable to be raised, and so on.

DISCLOSURE OF THE INVENTION

Accordingly, an object of the present invention is to provide a semiconductor device that makes it possible to cope with the operating frequency in the order of GHz at a reasonable cost and that produces no restriction on the integration scale, and a method of fabricating the device.

Another object of the present invention is to provide a semiconductor device capable of coping with the operating frequency in the order of GHz using a base with a low dielectric constant material film whose relative dielectric constant is lower than silicon, and a method of fabricating the device.

Still another object of the present invention is to provide a semiconductor device capable of coping with a situation where the wavelength of a signal or signals to be processed becomes close to the wiring length with the expanding size of the semiconductor device (chip) and the increasing operation speed thereof, and a method of fabricating the image sensor.

The other objects not specifically mentioned here will become clear from the following description.

A semiconductor device according the present invention comprises:

(a) a base having a first surface and a second surface located on an opposite side to the first surface;
  the base including a low dielectric constant material film whose relative dielectric constant is lower than silicon;

(b) a first semiconductor element layer including a semiconductor element;
  the first semiconductor element layer being formed on or over the first surface of the base directly or by way of another layer;

(c) a first wiring layer formed on or over the first semiconductor element layer directly or by way of another layer; and (d) an electrode formed on the second surface of the base;
  wherein the semiconductor element of the first semiconductor element layer is formed by an island-shaped semiconductor film and is buried in an insulator film formed in the first semiconductor element layer.

With the semiconductor device according to the invention, the first semiconductor element layer is formed on or over the first surface of the base directly or by way of another layer, where the base includes the low dielectric constant material film whose relative dielectric constant is lower than silicon. On or over the first semiconductor element layer, the first wiring layer is formed directly or by way of another layer. The electrode is formed on the second surface of the base. Moreover, the semiconductor element of the first semiconductor element layer is formed by the island-shaped semiconductor film and is buried in the insulator film formed in the first semiconductor element layer.

As a result, a silicon film, which is generally used and lower in cost than a compound semiconductor film such as GaAs, can be used as a semiconductor film for forming the semiconductor element. Moreover, the amount of use (i.e., the area) of the silicon film can be restrained at a minimum necessary for forming the semiconductor element. In other words, signal propagation delay induced by the silicon film can be restrained at a minimum level.

On the other hand, it is sufficient for the base to support the first semiconductor element layer including the semiconductor element, the first wiring layer, and the electrode; in other words, the base is not directly used for forming the semiconductor element. Therefore, the base can be formed by using an arbitrary low dielectric constant material film with a relative dielectric constant lower than silicon.

Accordingly, it is possible to cope with the operating frequency in the order of GHz at a reasonable cost without restriction on the integration scale.

Further, the electrode is formed on the second surface of the base and therefore, the electrode constitutes a so-called "return path" for a signal or signals transmitted though the first wiring layer. Therefore, it is possible to cope with a situation where the wavelength of a signal or signals to be processed becomes close to the wiring length with the expanding size of semiconductor devices and the increasing operation speed thereof.

In the semiconductor device according to the invention, the low dielectric constant material film of the base may be formed by any material whose relative dielectric constant is lower than silicon, for example, alumina ($Al_2O_3$), silicon carbide (SiC), diamond, sapphire, aluminum nitride (AlN), glass, organic material such as plastic, or porous inorganic or organic material such as porous SOG or porous plastic material. Preferably, any material known as a so-called "low-k material" (e.g., HSQ, SiOF, organic SOG, BCB, SILK, porous material, polyimide, or Tefron (registered trademark) ) may be used for the low dielectric constant material film.

In a preferred embodiment of the device according to the invention, the base includes a substrate made of insulator, semiconductor, or metal, and the low dielectric constant material film is formed on the substrate. In this embodiment, the low dielectric constant material film itself necessitates no rigidity and therefore, there is an advantage that the low dielectric constant material film has a wide selection range and that optimum material can be easily selected according to the purpose or use. As the substrate, a metal plate such as Cu or Al is preferably used; however, an organic material film (insulator or semiconductor) such as plastic, a packaging film, or a packaging substrate (insulator) such as a glass-epoxy substrate may be used.

The numbers of the low dielectric constant material film and the substrate are not limited to unity, respectively. In other words, a stacked structure comprising three layers or more may be used, where a plurality of the low dielectric constant material films or the substrates are included.

The base may be formed by only the low dielectric constant material film if it has at least such rigidity as to support the first semiconductor element layer and the first wiring layer. This is because there is an advantage that the structure of the base is simplified in this case.

In another preferred embodiment of the device according to the invention, the insulator film burying the semiconductor element of the first semiconductor element layer is located opposite to the first surface of the base. Alternately, an opposite surface of the first semiconductor element layer to the insulator film burying the semiconductor element is located opposite to the first surface of the base.

In still another preferred embodiment of the device according to the invention, a second semiconductor element layer or a second wiring layer is additionally provided between the first surface of the base and the first semiconductor element layer. The first semiconductor element layer is formed over the first surface of the base by way of the second semiconductor element layer or the second wiring layer. Alternately, a second semiconductor element layer or a second wiring layer is additionally provided between the first semiconductor element layer and the first wiring layer. The first wiring layer is formed over the first semiconductor element layer by way of the second semiconductor element layer or the second wiring layer.

In a further preferred embodiment of the device according to the invention, the semiconductor element of the first semiconductor element layer is a field-effect transistor formed in the island-shaped semiconductor film. The transistor comprises a first gate electrode formed on one side of the semiconductor film and a second gate electrode formed on an opposite side of the semiconductor film to the first gate electrode. In this embodiment, there is an advantage that the operation speed can be raised compared with the case where only one gate electrode is provided, and that current leakage due to the short-channel effects is prevented.

In a still further preferred embodiment of the device according to the invention, the semiconductor element of the first semiconductor element layer is a field-effect transistor formed in the island-shaped semiconductor film. The transistor comprises a first gate electrode formed on one side of the semiconductor film. In this embodiment, there is an advantage that the structure and fabrication method of the semiconductor element are simplified compared with the case where two gate electrodes are provided.

The first gate electrode of the field-effect transistor is preferably located on a side of the base with respect to the island-shaped semiconductor film.

In a still further preferred embodiment of the device according to the invention, a buried interconnection penetrating through the base is additionally provided. The electrode is formed to contact the interconnection, thereby producing a function of interposer.

A method of fabricating a semiconductor device according to the invention, comprises the steps of:
(a) forming a base having a first surface and a second surface located on an opposite side to the first surface;
    the base including a low dielectric constant material film whose relative dielectric constant is lower than silicon;
(b) forming a semiconductor element on a sacrificial substrate using an island-shaped semiconductor film;
(c) forming an insulator film to cover the semiconductor element on the sacrificial substrate to bury the element in the insulator film; thereby forming a first semiconductor element layer;
(d) joining the first semiconductor element layer and the first surface of the base together directly or by way of another layer;
(e) eliminating the sacrificial substrate;
(f) forming a first wiring layer on or over an opposite side of the first semiconductor element layer to the base directly or by way of another layer; and
(g) forming an electrode on the second surface of the base.

With the method of fabricating a semiconductor device according to the invention, the base including the low dielectric constant material film whose relative dielectric constant is lower than silicon is formed in the step (a), and the semiconductor element is formed on the sacrificial substrate using the island-shaped semiconductor film in the step (b). Moreover, in the step (c), the insulator film is formed to cover the semiconductor element on the sacrificial substrate to bury the element in the insulator film, thereby forming the first semiconductor element layer. In the step (d), the first semiconductor element layer and the first surface of the base are joined together directly or by way of another layer. In the step (e), the sacrificial substrate is eliminated. In the step (f), the first wiring layer is formed on or over the opposite side of the first semiconductor element layer to the base directly or by way of another layer. In the step (g), the electrode is formed on the second surface of the base. Therefore, it is apparent that the above-described semiconductor device according to the invention is obtainable.

In a preferred embodiment of the method according to the invention, the base used in the step (a) includes a substrate made of insulator, semiconductor, or metal. The low dielectric constant material film is formed on the substrate. In this embodiment, the low dielectric constant material film itself necessitates no rigidity and therefore, there is an additional advantage that the low dielectric constant material film has a wide selection range and that optimum material can be easily selected according to the purpose or use.

However, the base used in the step (a) may be formed by only the low dielectric constant material film. In this case, the low dielectric constant material film needs to have at least such rigidity as to support the first semiconductor element layer and the first wiring layer. However, there is an advantage that the structure of the base is simplified.

Regarding the substrate and the low dielectric constant material film, the above-described matters explained for the semiconductor device according to the invention are applicable as they are.

In another preferred embodiment of the method according to the invention, in the step (d), the insulator film burying the semiconductor element of the first semiconductor element layer and the first surface of the base are opposed and joined together. Alternately, an opposite surface of the first semiconductor element layer to the insulator film burying the semiconductor element and the first surface of the base are opposed and joined together.

In still another preferred embodiment of the method according to the invention, in the step (d), the first semiconductor element layer and the first surface of the base are joined together by way of a second semiconductor element layer or a second wiring layer. Alternately, in the step (f), the first wiring layer is formed over an opposite side of the first semiconductor element layer to the base by way of a second semiconductor element layer or a second wiring layer.

In a further preferred embodiment of the method according to the invention, the semiconductor element formed by using the island-shaped semiconductor film in the step (b) is a field-effect transistor. The transistor comprises a first gate electrode formed on one side of the semiconductor film, and a second gate electrode formed on an opposite side to the first gate electrode. In this embodiment, there is an advantage that the operation speed of the transistor is raised compared with the case where only one gate electrode is provided, and that current leakage due to the short-channel effects is prevented.

In a still further preferred embodiment of the method according to the invention, the semiconductor element formed by using the island-shaped semiconductor film in the step (b) is a field-effect transistor. The transistor comprises a first gate electrode formed on one side of the semiconductor film. In this embodiment, there is an advantage that the structure and fabrication method of the semiconductor element are simplified compared with the case where two gate electrodes are provided.

Preferably, the first gate electrode of the field-effect transistor is located on a side of the base with respect to the island-shaped semiconductor film when the first semiconductor element layer and the first surface of the base are joined together in the step (d). However, the first gate electrode of the field-effect transistor may be located on a side of the first wiring layer with respect to the island-shaped semiconductor film.

In a still further preferred embodiment of the method according to the invention, a step of forming a buried interconnection penetrating through the base is additionally provided between the steps (d) and (e). The electrode is formed to contact the interconnection in the step (g), thereby realizing a function of interposer.

BEST MODE FOR CARRYING OUT THE INVENTION

Figure 1:
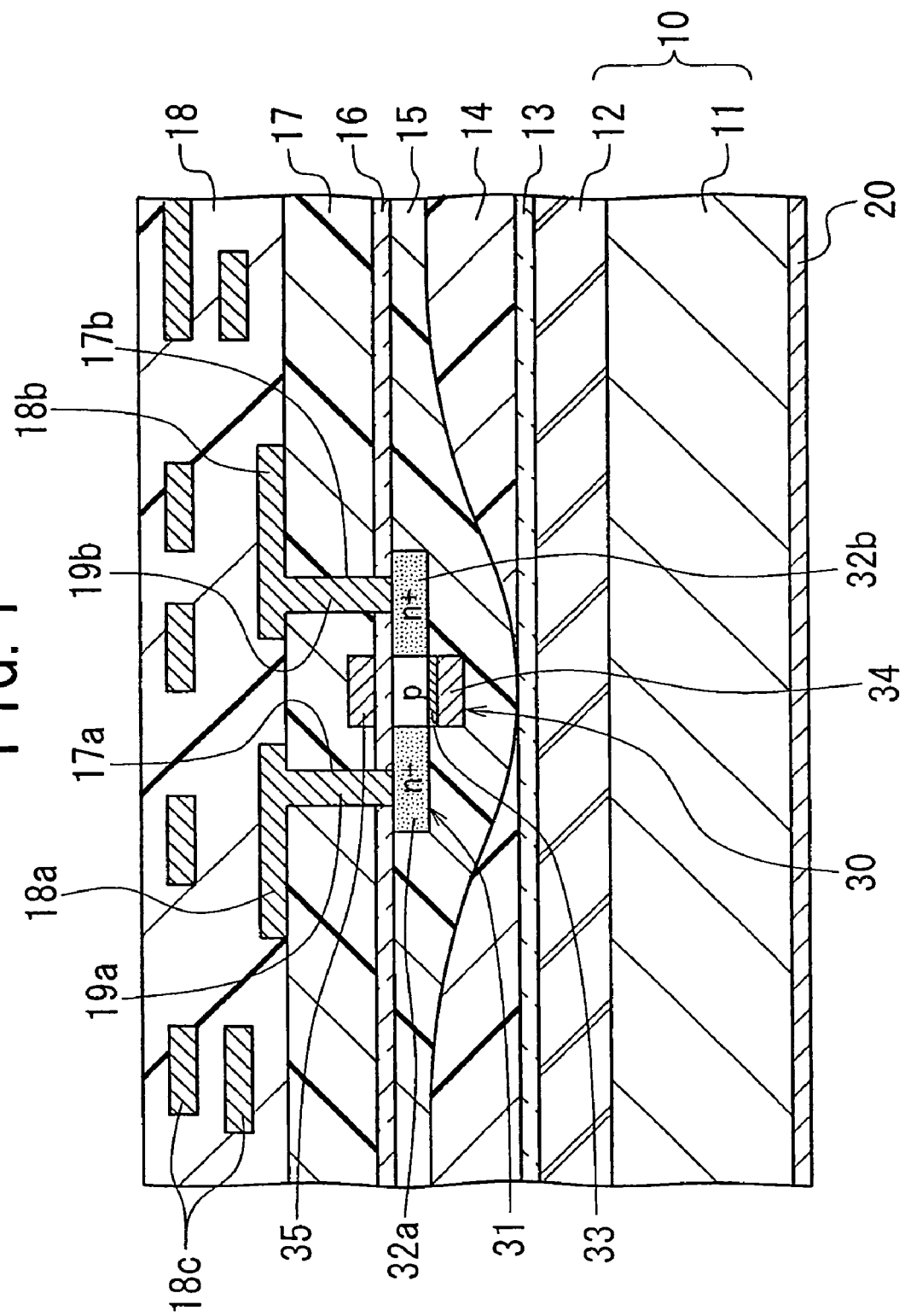
FIG. 1 is a schematic cross-sectional view of a main part of a semiconductor device according to a first embodiment of the invention, which shows the configuration thereof.

Preferred embodiments of the present invention will be described below while referring to the drawings attached.

First Embodiment

FIG. 1 is a cross-sectional view showing the configuration of a main part of a semiconductor device according to a first embodiment of the invention.

As shown in FIG. 1, the semiconductor device according to the first embodiment comprises a substrate 11, and a low dielectric constant material film 12 formed on the substrate 11. The substrate 11 and the film 12 constitute a base 10. The base 10 has such rigidity as to support the multilayer structure formed thereon. The surface of the film 12 forms the first surface of the base 10. The second surface of the base 10 is formed by the back surface of the base 11.

A semiconductor element layer including a MOS transistor 30 is fixed on the first surface of the base 10, i.e., on the surface of the low dielectric constant material film 12, with an adhesive film 13. The semiconductor element layer is constituted by the MOS transistor 30, interlayer insulator films 14 and 15, and insulator films 16 and 17. Further, a multilayer wiring structure 18 is formed on the semiconductor element layer (i.e., on the insulator film 17).

A lower electrode 20 is formed on the second surface of the base 10, i.e., on the back surface of the substrate 11. The electrode 20 covers entirely or partially the back surface of the substrate 11.

Preferably, to suppress the parasitic capacitance, the low dielectric constant material film 12 of the base 10 is made of an insulative material having a relative dielectric constant as low as possible. An organic, inorganic, or porous insulative material may be used as the insulative material. Concretely speaking, it is preferred that the film 12 is made of an insulative material which has a relative dielectric constant lower than the relative dielectric constant (11.8) of silicon and a high thermal conductivity, and which is low in cost. The reason why a high thermal conductivity is preferred is that the heat generated by the MOS transistor 30 in the semiconductor element layer is efficiently conducted toward the substrate 11. Moreover, if so, the heat is efficiently dissipated to the outside. As a material satisfying these three conditions (i.e., low relative dielectric constant, high thermal conductivity, and low cost), for example, alumina ($Al_2O_3$) or silicon carbide (SiC) is preferred. Although the cost is slightly higher compared with alumina and silicon carbide, diamond having a low relative dielectric constant and a high thermal conductivity may be used.

However, to form the low dielectric constant material film 12, any other material than these materials may be used. For example, sapphire, aluminum nitride (AlN), various kinds of glass, or a porous, low dielectric constant plastic may be used.

Since the substrate 11 of the base 10 supports the low dielectric constant material film 12 and its overlying multilayer structure, the substrate 11 is made of a material that does not hinder the characteristic of the low relative dielectric constant of the film 12. Therefore, the substrate 11 may be made of any insulator, semiconductor, or metal if it has such the characteristic as above.

In this embodiment, the base 10 has a two-layer structure comprising the substrate 11 and the low dielectric constant material film 12; however, the invention is not limited to this structure. If rigidity is obtained to a certain extent, the whole base 10 may be made of the material used for the low dielectric constant material film 12. This means that the base 10 may be formed by only the low dielectric constant material film 12. For example, if the film 12 is made of $Al_2O_3$, SiC, or diamond, this is easily realizable.

The thickness of the substrate 11 is optionally set in a range of, for example, 1 μm to 300 μm, according to the necessity. The thickness of the low dielectric constant material film 12 is optionally set in a range of, for example, 0.1 μm to 50 μm, according to the necessity. Therefore, when the respective thicknesses of the substrate 11 and the film 12 are set at smallish values, flexibility can be given to the base 10.

The MOS transistor 30 provided in the semiconductor element layer is formed by using an island-shaped p-type single-crystal silicon (Si) film 31. A pair of $n^+$-type source/drain regions 32a and 32b is formed in the Si film 31 to be apart from each other. A gate insulator film 33 is formed on the surface (i.e., the lower surface in FIG. 1) of the Si film 31. The gate insulator film 33 is located between the source/drain regions 32a and 32b. A gate electrode 34 made of polysilicon is formed on the surface (i.e., the lower surface in FIG. 1) of the gate insulator film 33. The gate electrode 34 may be made of metal.

The back surface (i.e., the upper surface in FIG. 1) of the Si film 31 is covered with an insulator film 16. On the film 16, a second gate electrode 35 made of metal is formed. The second gate electrode 35 has approximately the same shape as the gate electrode 34. The gate electrodes 34 and 35 are arranged to be superposed on each other. Therefore, the second gate electrode 35 is located between the source/drain regions 32a and 32b as well. The part of the insulator film 16 right below the second gate electrode 35 serves as a gate insulator film.

Generally, a signal voltage is applied to the gate electrode 34. On the other hand, a signal voltage may be applied to the second gate electrode 35 similar to the gate electrode 34, or a predetermined fixed potential may be applied to the electrode 35.

The thickness of the island-shaped single-crystal silicon film 31 is optionally set in a range of, for example, 10 nm to 100 nm, as necessary. The shape of the film 31 is usually rectangular, and the size of the film 31 is appropriately set in such a way that the transistor 30 has desired characteristics. The thickness of the gate insulator film 33 is optionally set in a range of, for example, 1 nm to 10 nm. The thickness of the gate electrode 34 is optionally set in a range of, for example, 50 nm to 500 nm. The thickness of the second gate electrode is set, for example, to be similar to the thickness of the gate electrode 34. As described later, it is preferred that the transistor 30 is formed by using a SOI substrate.

The MOS transistor 30 with the above-described structure is buried in the stacked structure of the interlayer insulator film 15 and the insulator films 16 and 17. Thus, the area (i.e., the amount used) of the single-crystal silicon film 31 is extremely small compared with the case where the single-crystal silicon substrate 41 is left.

The source/drain regions 32a and 32b of the transistor 30 are electrically connected to the multilayer wiring structure 18 by way of the contact holes 17a and 17b, respectively, where each of the holes 17a and 17b penetrates vertically the insulator films 16 and 17. Specifically, the contact holes 17a and 17b are formed to vertically pass through the stacked insulator films 16 and 17. Conductive contact plugs 19a and 19b are filled in the holes 17a and 17b, respectively. The plugs 19a and 19b are made of a conductive material, such as tungsten (W), aluminum (Al), or copper (Cu). Ends (lower ends in FIG. 1) of the plugs 19a and 19b contact the source/drain regions 32a and 32b located just below them, respectively. Other ends (upper ends in FIG. 1) of the plugs 19a and 19b contact wiring electrodes 18a and 18b of the multilayer wiring structure 18, respectively, which are located near the surface of the insulator film 17. In this way, the source/drain regions 32a and 32b of the transistor 30 are electrically connected to internal metal wiring 18c of the wiring structure 18.

The gate electrode 34 and the second gate electrode 35 of the MOS transistor 30 are electrically connected to wiring or conductive film not shown here. A concrete structure of this electric connection is known and thus, explanation about it is omitted.

The adhesive film 13 joining the base 10 and the semiconductor circuit layer is made of an arbitrary insulative adhesive and has a thickness of 0.1 µm to several micrometers. For example, epoxy resin or polyimide resin is preferably used. It is preferred that the adhesive film 13 has a dielectric constant as low as possible.

The interlayer insulator film 14 is made of, for example, TEOS. The surface (the lower surface in FIG. 1) of the film 14 is planarized.

The interlayer insulator film 15 buries the whole transistor 30 except for the second gate electrode 35, which is made of, for example, BPSG. The thickness of the film 15 is, for example, 0.1 µm to 3 µm.

The insulator film 16 is included in the SOI substrate that has been used for forming the MOS transistor 30, which is typically made of $SiO_2$. However, the film 16 may be formed later. The thickness of the film 16 is optional.

The insulator film 17 provides a function of electrical insulation between the transistor 30 and the multilayer wiring structure 18. The film 17 is made of an arbitrary insulative material (e.g., BPSG). The thickness of the film 17 is optional.

The multilayer wiring structure 18 is formed by stacking a plurality of metal wirings 18c along with intervening insulator layers. Since the configuration of the wiring structure 18 is known, detailed explanation about it is omitted here.

With the above-described configuration, the MOS transistor 30, and the interlayer insulator films 14 and 15 and the insulator films 16 and 17 that bury the transistor 30 constitute the "semiconductor element layer". The multilayer wiring structure 18 constitutes the "wiring layer".

Next, a method of fabricating the semiconductor device according to the first embodiment having the above-described configuration will be explained below with reference to FIGS. 2 to 8.

Figure 2:
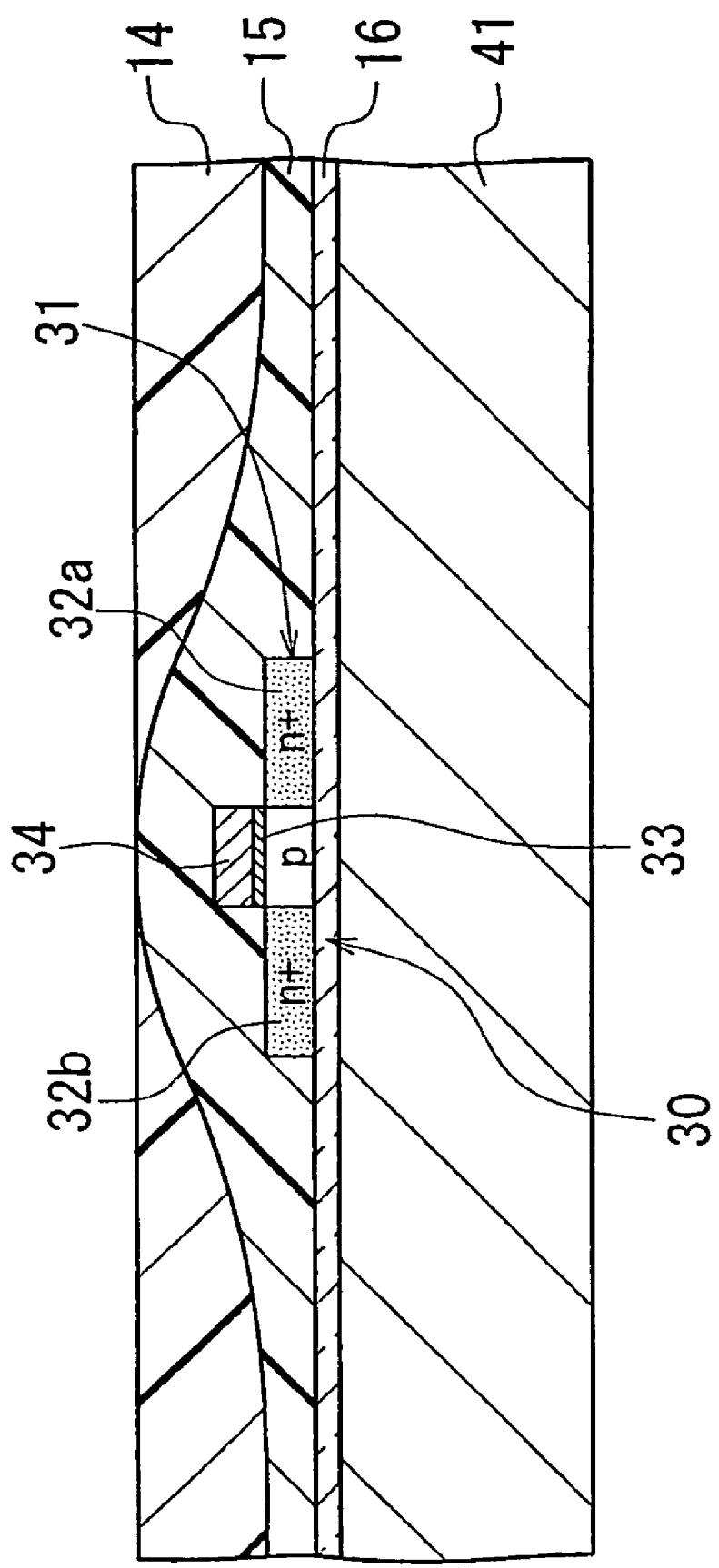
FIG. 2 is a view showing the process steps of a method of fabricating the semiconductor device according to the first embodiment of FIG. 1.

First, the structure as shown in FIG. 2 is formed by a known method. Here, the structure of FIG. 2 is formed by using an arbitrary SOI substrate; however, the invention is not limited to this.

For example, a "bonded substrates" comprising a single-crystal Si substrate 41, the single-crystal Si film 31, and the intervening insulator film 16 is prepared. Then, the Si film 31 is selectively etched until the etching action reaches the insulator film 16, thereby defining an approximately rectangular island-shaped element-formation region. Next, by thermal oxidation and etching methods, the gate electrode 33 is selectively formed at a predetermined location on the surface of the Si film. A polysilicon film is formed on the gate insulator film 33 and etched, thereby forming the gate electrode 34. Thereafter, by an ion-implantation method, a n-type impurity is selectively introduced into the Si film 31 using the gate electrode 34 as a mask, thereby forming the pair of source/drain regions 32a and 32b. In this way, the MOS transistor 30 having the structure as shown in FIG. 2 is formed on the insulator film 16.

Needless to say, a so-called "SIMOX (Separation by IMplantation of OXygen) substrate" or other similar substrate ay be used instead of the above-described "bonded substrate".

Subsequently, the interlayer insulator film 15 is formed on the insulator film 16 to cover the whole MOS transistor 30. The interlayer insulator film 14 is then formed on the film 15.

Finally, the surface of the interlayer insulator film 14 is planarized by a CMP (Chemical Mechanical Polishing) or etching method. Thus, the structure as shown in FIG. 2 is obtained.

The method of forming the structure of FIG. 2 is an example and therefore, it is needless to say that the structure of FIG. 2 may be formed by any other method.

Figure 3:
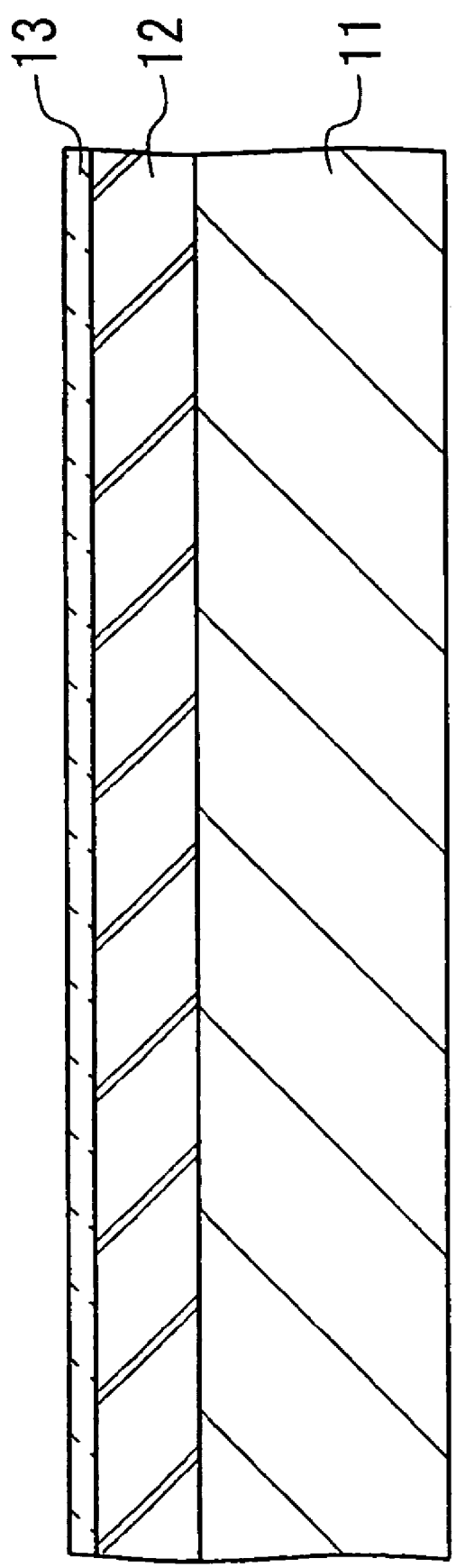
FIG. 3 is a view showing the process steps of the method of fabricating the semiconductor device according to the first embodiment of FIG. 1.

On the other hand, as shown in FIG. 3, the low dielectric constant material film 12 having the above-described character is formed on the substrate 11 made of insulator, semiconductor, or metal, resulting in the base 10. The film 12 may be adhered onto the surface of the substrate 11 with an appropriate adhesive after the film 12 is formed separately from the substrate 11. The film 12 may be directly formed and fixed onto the surface of the substrate 11 by a CVD (Chemical Vapor Deposition) method or the like. The surface of the film 12 thus formed is planarized by an arbitrary method.

Next, an appropriate adhesive is coated on the surface of the low dielectric constant material film 12 to form an adhesive film 13. The state at this stage is shown in FIG. 3. The adhesive may be coated on the surface of the insulator film 14 in the state of FIG. 2. Moreover, the adhesive may be coated on the surfaces of the low dielectric constant material film 12 and the insulator film 14.

Needless to say, the coating of the adhesive film 13 may be omitted if the low dielectric constant material film 12 itself has an adhesion capability.

Figure 4:
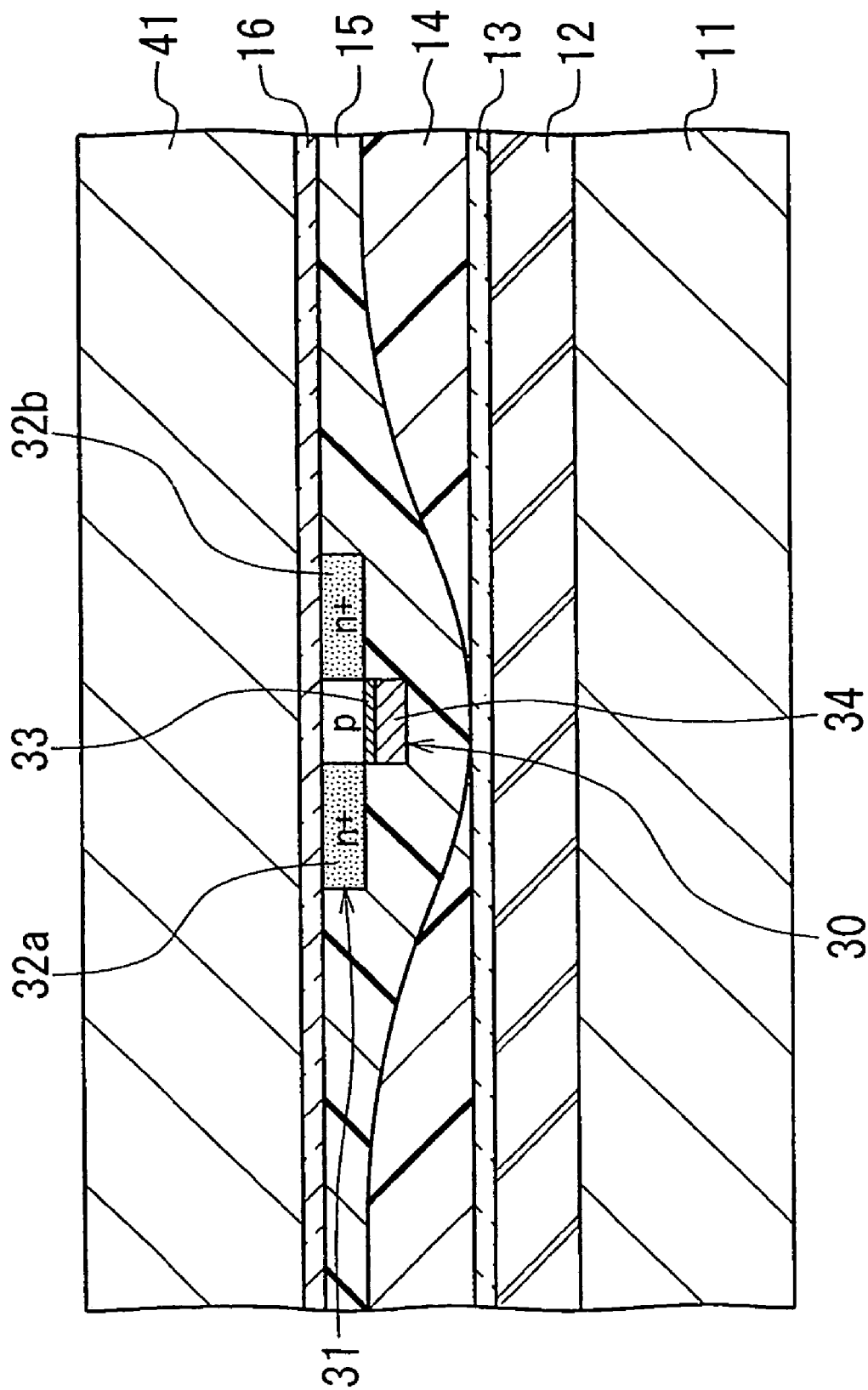
FIG. 4 is a view showing the process steps of the method of fabricating the semiconductor device according to the first embodiment of FIG. 1, which is subsequent to the steps of FIGS. 2 and 3.

Following this, the structure of FIG. 2 is turned upside down and joined to the structure of FIG. 3 while making their positional alignment, thereby unifying them as shown in FIG. 4. In other words, the planarized surface of the interlayer insulator film 14 is opposed to the flat surface of the low dielectric constant material film 12 and then, these films 14 and 12 are joined together with the adhesive film 13. In this state, a predetermined curing treatment is applied to the adhesive film 13 and as a result, the film 13 is cured and the semiconductor element layer is joined to the base 10. At this time, the substrate 11 is located in the lowest level and the Si substrate 41 is located in the highest level. The MOS transistor 30 is in its reversed position.

Figure 5:
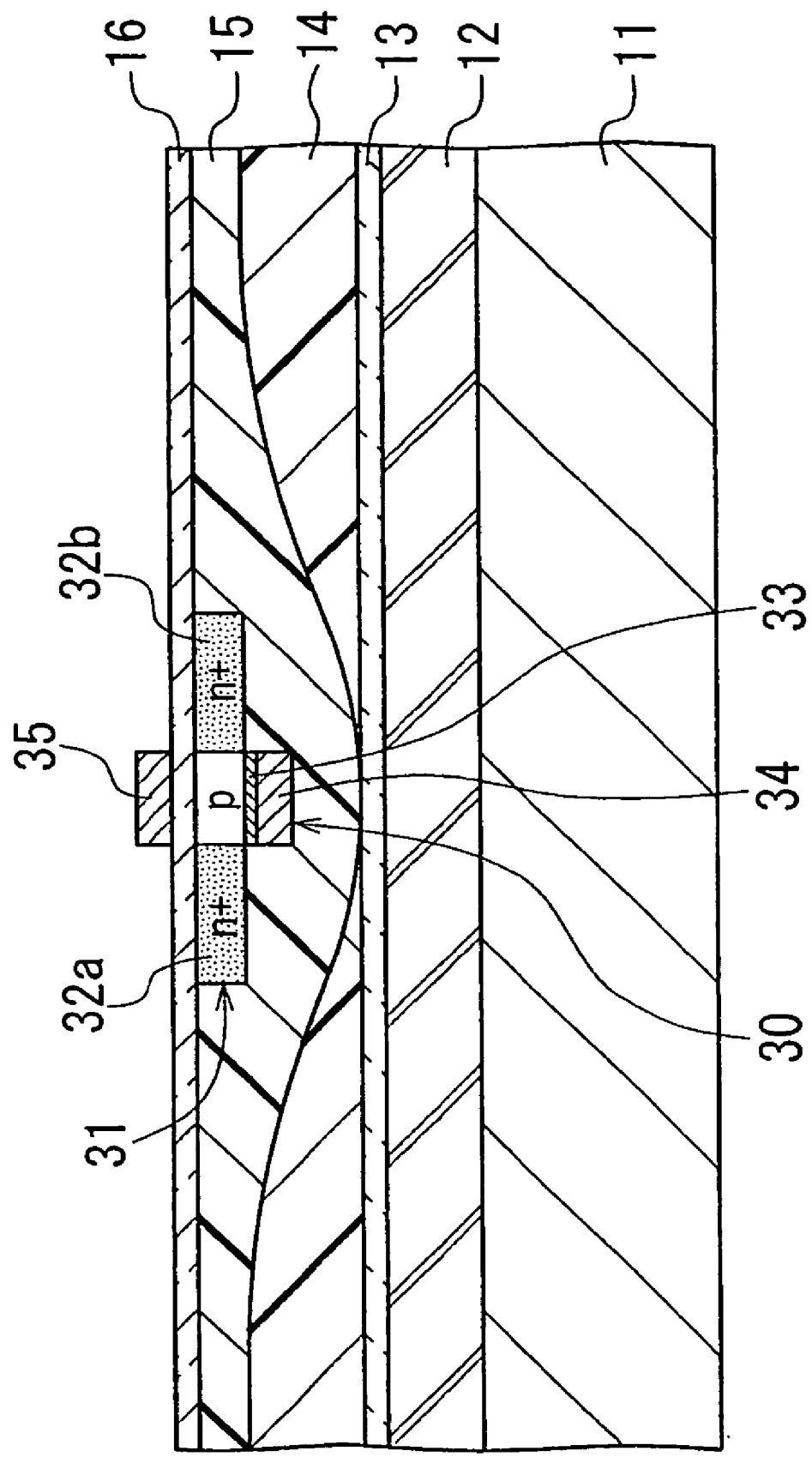
FIG. 5 is a view showing the process steps of the method of fabricating the semiconductor device according to the first embodiment of FIG. 1, which is subsequent to the step of FIG. 4.

Next, the Si substrate 41 in the highest level is entirely removed by polishing or etching, thereby exposing the insulator film 16, as shown in FIG. 5. Then, an appropriate metal film (e.g., W) is formed on the insulator film 16 and patterned by etching, thereby forming the second gate electrode 35. The state at this stage is shown in FIG. 5.

Since the substrate 41 is entirely removed within the fabrication process sequence as described above, it may be termed the "sacrificial substrate".

Figure 6:
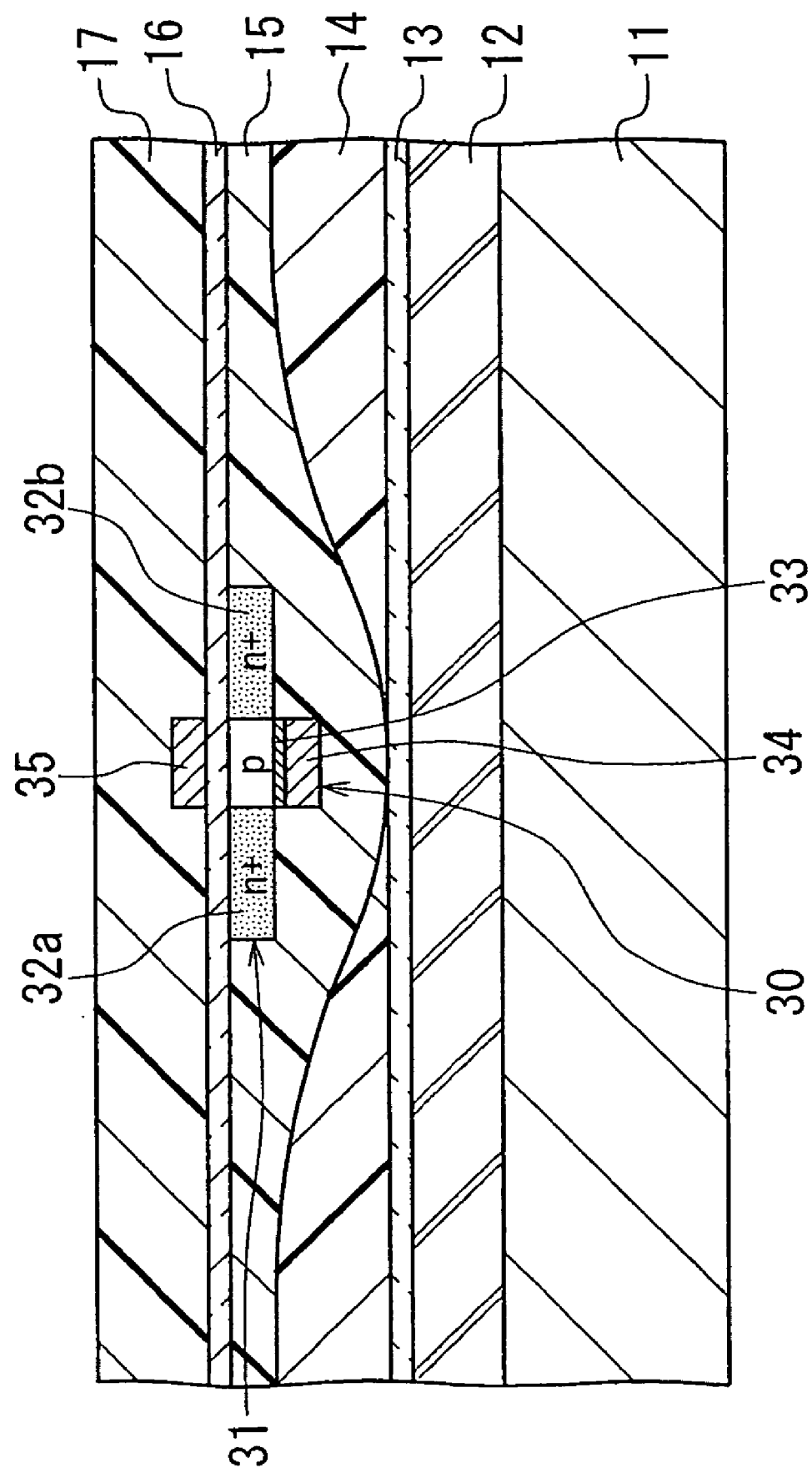
FIG. 6 is a view showing the process steps of the method of fabricating the semiconductor device according to the first embodiment of FIG. 1, which is subsequent to the step of FIG. 5.

Next, as shown in FIG. 6, the insulator film 16 is formed on the insulator film 17 to cover the second gate electrode 35. According to the necessity, the surface planarization of the film 17 is carried out by a CMP method or the like.

Figure 7:
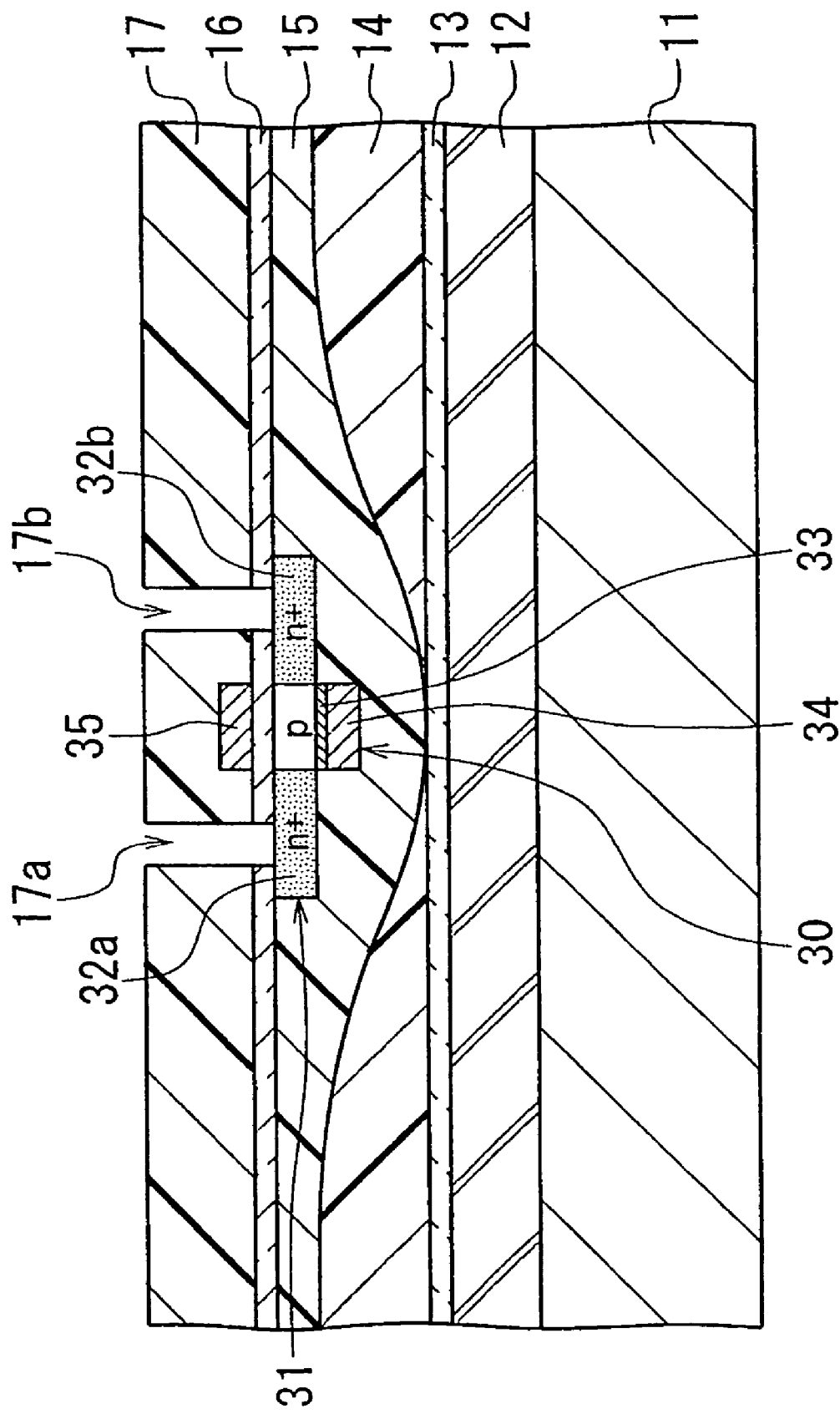
FIG. 7 is a view showing the process steps of the method of fabricating the semiconductor device according to the first embodiment of FIG. 1, which is subsequent to the step of FIG. 6.

Subsequently, as shown in FIG. 7, the contact holes 17a and 17b each penetrating through the insulator films 17 and 16 are formed by etching, thereby exposing the source/drain regions 32a and 32b (i.e., the back surface of the single-crystal Si film 31).

Figure 8:
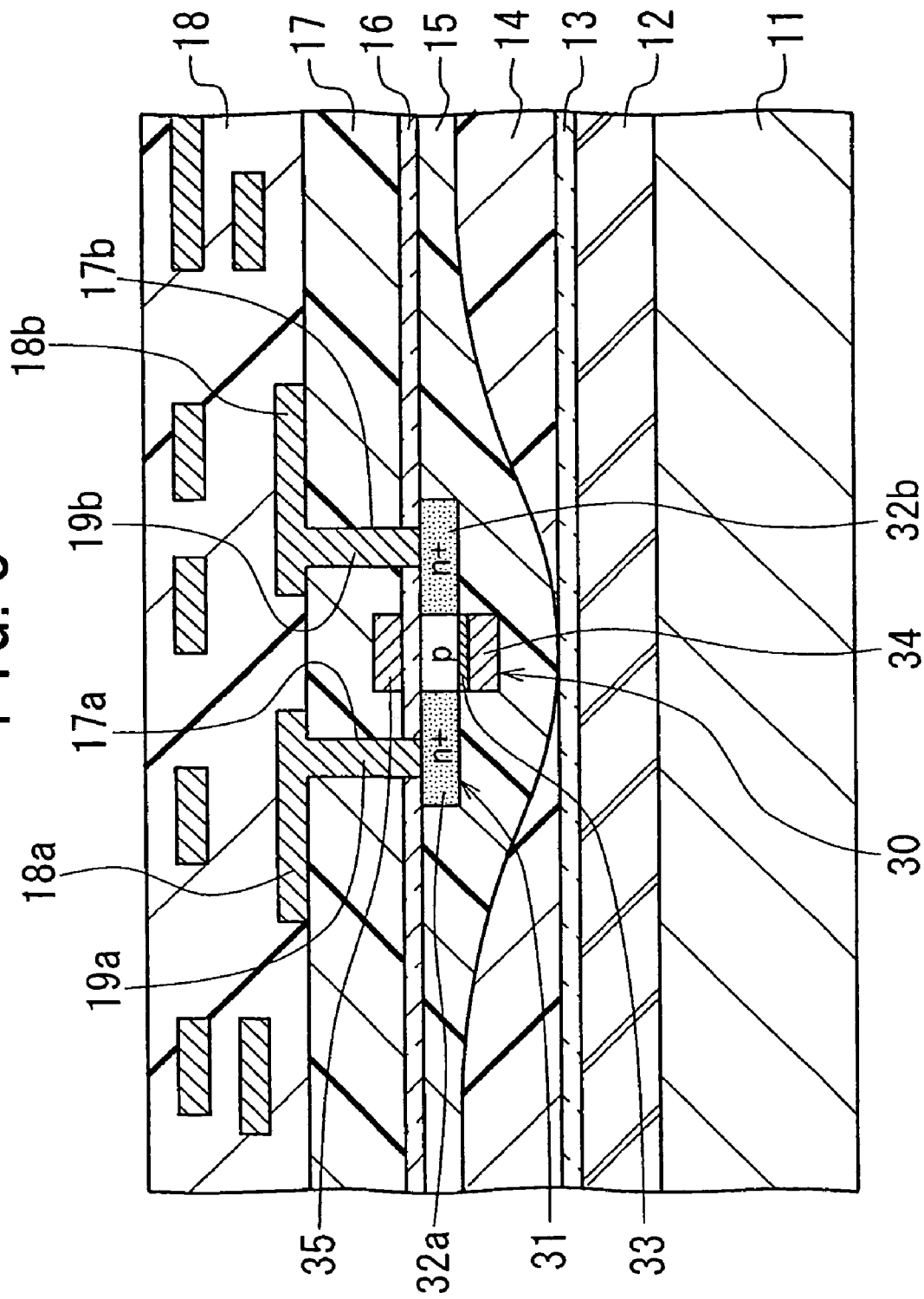
FIG. 8 is a view showing the process steps of the method of fabricating the semiconductor device according to the first embodiment of FIG. 1, which is subsequent to the step of FIG. 7.

Next, a conductive film (not shown) with such a thickness as to fill the contact holes 17a and 17b is formed on the insulator film 17 and thereafter, an etch back or CMP method is applied to the conductive film, thereby selectively removing the conductive film at the location other than the holes 17a and 17b. Thus, as shown in FIG. 8, the contact plugs 19a and 19b are respectively formed by the conductive film in the holes 17a and 17b. As the conductive film, for example, W, Al, Cu or the like may be used.

Thereafter, the multilayer wiring structure 18 including the wiring electrodes 18a and 18b and the metal wiring 18c is formed on the insulator film 17 by a known method.

Finally, a metal film made of copper, aluminum or the like is formed on the part or whole of the lower surface of the substrate 11 by an evaporation or plating method, resulting in the lower electrode 20. In this way, the semiconductor device according to the first embodiment as shown in FIG. 1 is obtained.

Additionally, the lower electrode 20 may be formed on the back surface of the substrate 11 beforehand at the time when the base 10 is formed by the substrate 11 and the low dielectric constant material film 12, as shown in FIG. 3.

With the semiconductor device according to the first embodiment of the invention, as explained above, the semiconductor element layer including the MOS transistor 30 is formed on the base 10 that includes the low dielectric constant film 12 whose relative dielectric constant is lower than silicon. On the semiconductor element layer, the multilayer wiring structure 18 (i.e., the wiring layer) is formed. The lower electrode 20 is formed on the lower surface of the base 10. Further, the transistor 30, which is formed by using the very small island-shaped single-crystal Si film 31, is buried in the combination of the interlayer insulator films 14 and 15 and the insulator films 16 and 17.

In this way, the single-crystal Si film 31, which is used in popular, is used and therefore, the semiconductor device of the first embodiment is fabricated at low cost. Moreover, the amount of use (i.e., the area) of the silicon film 31 is restrained at a minimum necessary for forming the transistor 30.

Moreover, the base 10 includes the substrate 11 with rigidity at a certain extent and the low dielectric constant material film 12 formed by using the material whose relative dielectric constant is lower than silicon.

Accordingly, it is possible to cope with the operating frequency in the order of GHz at a reasonable cost without restriction on the integration scale.

In addition, the lower electrode 20 is formed on the lower surface of the base 10 and thus, the electrode 20 forms a "return path" for the signal or signals transmitted through the metal wiring 18c of the multilayer wiring structure 18.

As a result, even if the wavelength of the signal or signals to be processed becomes close to the wiring length according to expansion of the semiconductor chip size (i.e., the size of the said semiconductor device) and speedup of the operation thereof, the semiconductor device according to the first embodiment can cope with this situation.

Furthermore, with the above-described semiconductor device of the first embodiment, the MOS transistor 30 comprises the second gate electrode 35 along with the (first) gate electrode 34. Thus, the drain current change can be made larger, in other words, the driving current can be increased, compared with the case where the second gate electrode 35 is not provided. As a result, there is an advantage that the operation speed can be higher than the case where the second gate electrode 35 is not provided.

There is another advantage that the situation that a leakage current flows due to the short-channel effects when the transistor 30 is in its OFF state can be prevented, because the drain-field rounding is blocked by the second gate electrode 35.

Second Embodiment

Figure 9:
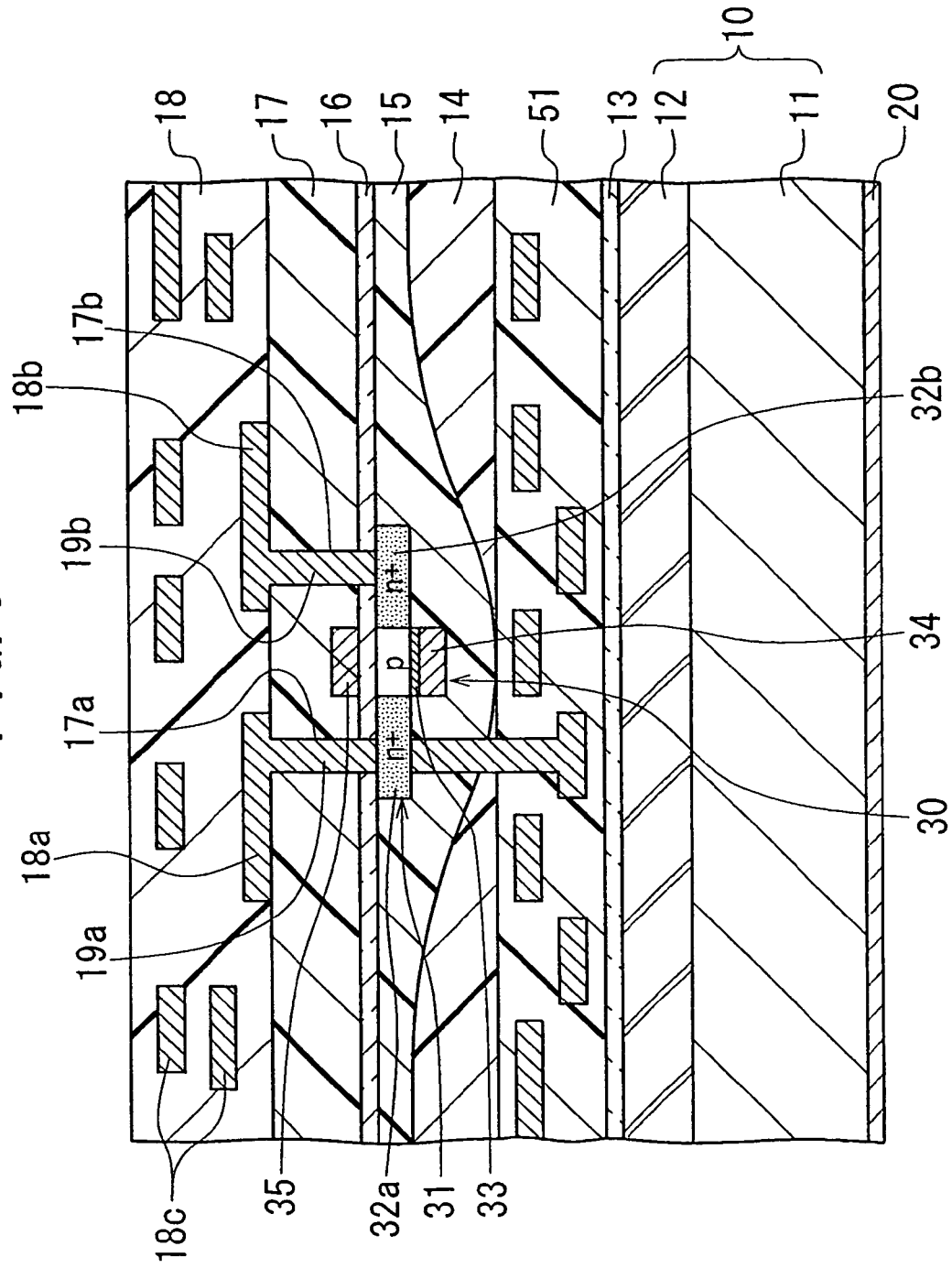
FIG. 9 is a schematic cross-sectional view of a main part of a semiconductor device according to a second embodiment of the invention, which shows the configuration thereof.

FIG. 9 is a cross-sectional view showing the configuration of a main part of a semiconductor device according to a second embodiment of the invention.

The semiconductor device of FIG. 9 corresponds to one obtained by adding a multilayer wiring structure 51 to the semiconductor device according to the first embodiment. Therefore, by attaching the same reference symbols as used for the device of the first embodiment to the same or corresponding elements in FIG. 9, detailed explanation about them is omitted here.

As shown in FIG. 9, the multilayer wiring structure 51 is provided between the low dielectric constant material film 12 forming the base 10, and the interlayer insulator film 14, in other words, the structure 51 is located between the base 10 and the semiconductor element layer. The source/drain region 32a of the transistor 30 in the semiconductor element layer is electrically connected to the predetermined wiring of the structure 51. The structure 51 is adhered on its surface to the low dielectric constant material film 12 by the adhesive film 13.

With the semiconductor device according to the second embodiment, the transistor 30, the interlayer insulator films 14 and 15, and the insulator films 16 and 17 constitute the "semiconductor element layer". The multilayer wiring structure 18 constitutes the "first wiring layer". The multilayer wiring structure 51 constitutes the "second wiring layer".

The device of the second embodiment having the above-described structure can be fabricated in a similar way as the first embodiment.

Figure 10:
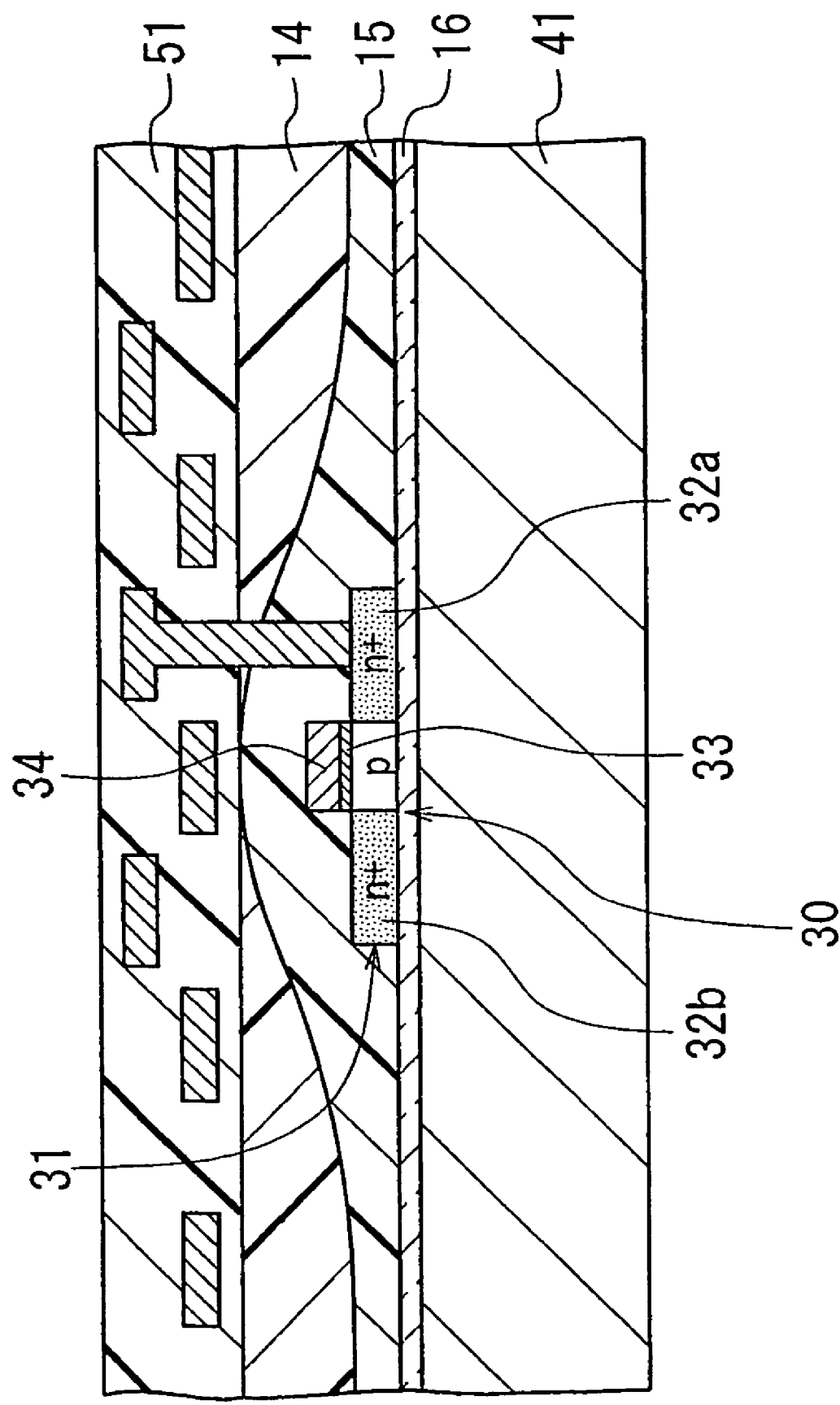
FIG. 10 is a view showing the process steps of a method of fabricating the semiconductor device according to the second embodiment of FIG. 9.
Figure 11:
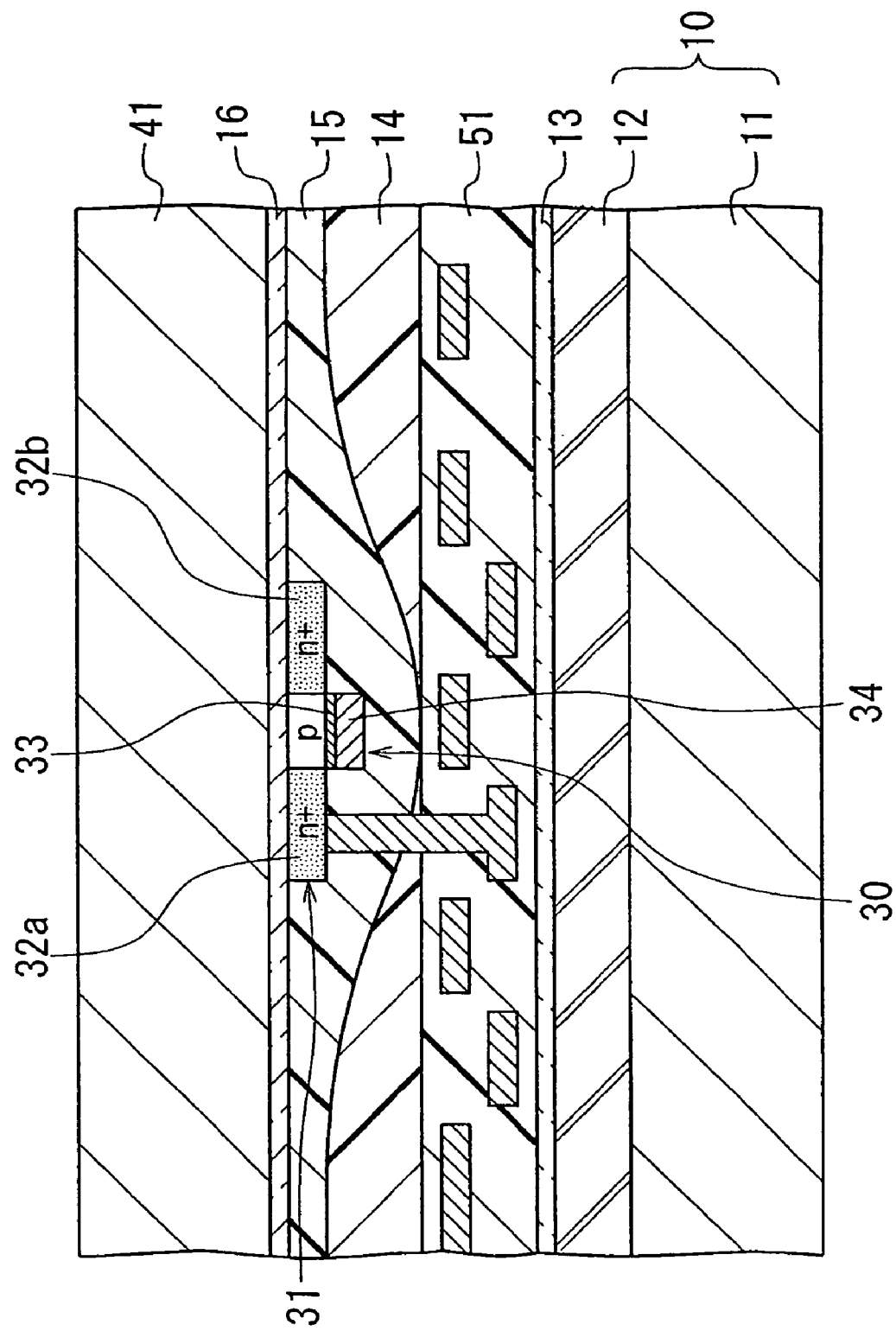
FIG. 11 is a view showing the process steps of the method of fabricating the semiconductor device according to the second embodiment of FIG. 9, which is subsequent to the step of FIG. 10.

Specifically, as shown in FIG. 10 (which corresponds to FIG. 2), in the same way as described in the first embodiment, the MOS transistor 30 is formed on the insulator film 16 located on the Si substrate 41. Then, the interlayer insulator film 15 is formed on the insulator film 16 to cover the whole transistor 30. Then, the interlayer insulator film 14 is formed on the film 15.

Subsequently, on the planarized surface of the interlayer insulator film 14, the wiring structure 51 is formed by a known method. At this time, the source/drain region 32a of the transistor 30 is electrically connected to the predetermined wiring in the structure 51 by way of the contact plug filled in the contact hole penetrating the interlayer insulator films 14 and 15. Since this method is the same as used for the wiring structure 18, explanation about it is omitted. Finally, the surface of the structure 51 is planarized by a CMP or etching method.

On the other hand, as shown in FIG. 3, the base 10 formed by the substrate 11 and the low dielectric material film 12 is formed and thereafter, the surface of the film 12 is planarized. Then, an appropriate adhesive is coated on the film 12 to form the adhesive film 13.

Subsequently, after turning it upside down, the structure of FIG. 10 is joined to the structure of FIG. 3 while making their positional alignment, thereby unifying them. In other words, the planarized surface of the wiring structure 51 is opposed to the flat surface of the low dielectric constant material film 12 and then, they are joined together by way of the adhesive film 13. By conducting a predetermined curing treatment to the film 13 in this state, the film 13 is cured and as a result, the semiconductor element layer is joined to the base 10. At this time, the substrate 11 is located in the lowest level while the Si substrate 41 is located in the highest level. The transistor 30 is in its reversed position.

Next, the whole Si substrate 41 in the highest level is removed by etching, thereby exposing the insulator film 16. Like the first embodiment, the second gate electrode 35 is formed on the film 16 and then, the insulator film 17 is formed on the film 16. Thereafter, in the same way as the first embodiment, the contact holes 17a and 17b and the contact plugs 19a and 19b are respectively formed. The lower electrode 20 is formed on the part or whole of the lower surface of the substrate 11. In this way, the semiconductor device having the structure of FIG. 9 is obtained.

As explained above, the semiconductor device according to the second embodiment has substantially the same configuration as the device according to the first embodiment. Therefore, the same advantages as those in the first embodiment are obtained.

Third Embodiment

Figure 12:
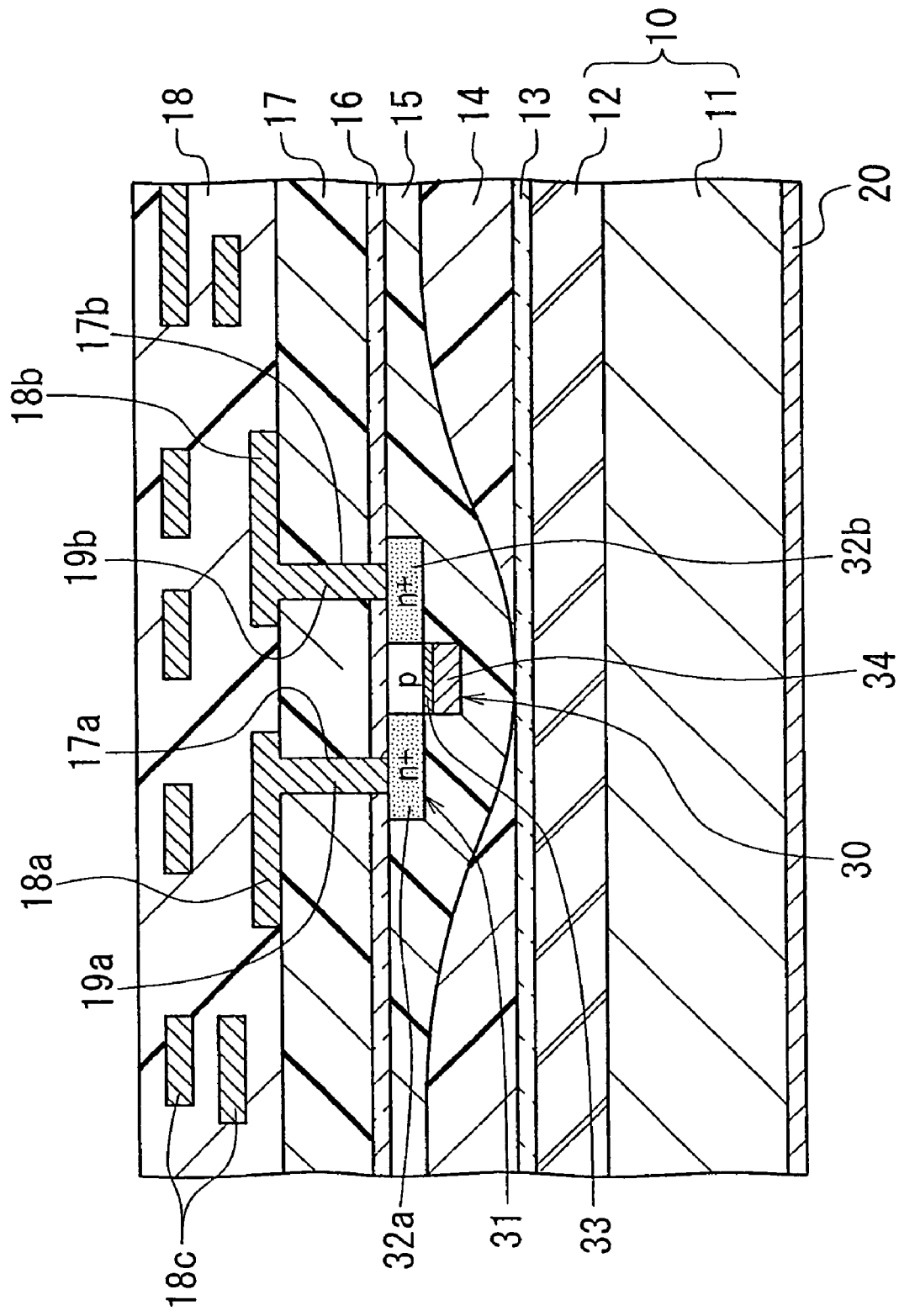
FIG. 12 is a schematic cross-sectional view of a main part of a semiconductor device according to a third embodiment of the invention, which shows the configuration thereof.

FIG. 12 is a cross-sectional view showing the configuration of a main part of a semiconductor device according to a third embodiment of the invention.

The semiconductor device of FIG. 12 corresponds to one obtained by omitting the second gate electrode 35 of the MOS transistor 30 from the semiconductor device according to the first embodiment. Thus, by attaching the same reference symbols as used for the device of the first embodiment to the same or corresponding elements in FIG. 12, detailed explanation about them is omitted here.

Since the semiconductor device according to the third embodiment of the invention has substantially the same configuration as the device according to the first embodiment and therefore, it is apparent that the same advantages as those in the first embodiment are obtained.

Additionally, with the device of the third embodiment, the transistor 30 do not have the second gate electrode 35. Thus, there is an advantage that the configuration and fabrication process sequence are simplified compared with the first embodiment having the second gate electrode 35.

Fourth Embodiment

Figure 13:
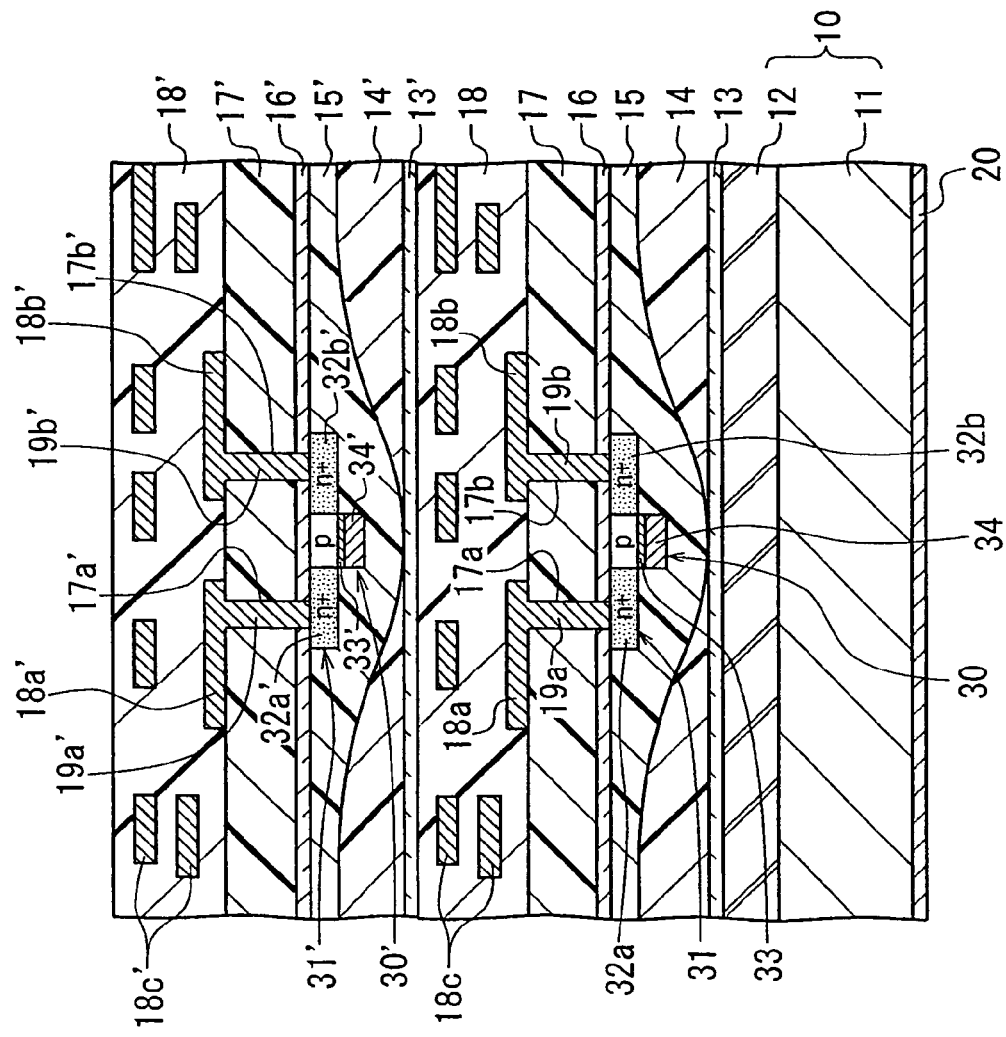
FIG. 13 is a schematic cross-sectional view of a main part of a semiconductor device according to a fourth embodiment of the invention, which shows the configuration thereof.

FIG. 13 is a cross-sectional view showing the configuration of a main part of a semiconductor device according to a fourth embodiment of the invention.

The semiconductor device of FIG. 13 corresponds to one obtained by vertically doubling the combination of the semiconductor element layer and the multilayer wiring structure in the semiconductor device (see FIG. 12) according to the third embodiment having no second gate electrode. Specifically, the "lower semiconductor element layer" comprising the MOS transistor 30, the interlayer insulator films 14 and 15, and the insulator films 16 and 17, and the "lower wiring structure" comprising the multilayer wiring structure 18 are stacked on the base 10. Furthermore, the "upper semiconductor element layer" comprising the MOS transistor 30', the interlayer insulator films 14' and 15', and the insulator films 16' and 17', and the "upper wiring structure" comprising the multilayer wiring structure 18' are stacked on the "lower wiring structure". Therefore, by attaching the same reference symbols as used for the device of the third embodiment to the same or corresponding elements in FIG. 13, detailed explanation about them is omitted here.

As explained above, the semiconductor device according to the fourth embodiment has substantially the same configuration as the device according to the third embodiment. Therefore, it is apparent that the same advantages as those in the third embodiment are obtained.

It is said that the configuration of the device according to the fourth embodiment is equal to one obtained by adding the "upper semiconductor element layer" and the "upper wiring layer" to the basic configuration of the invention constituted by the base 10, the "lower semiconductor element layer", and the "lower wiring layer". However, it may be said that the configuration of the fourth embodiment is equal to one obtained by forming the "upper semiconductor element layer" over the base 10 by way of the "lower semiconductor element layer" and the "lower wiring layer", and by additionally forming the "upper wiring layer" on the "upper semiconductor element layer". Moreover, it may be said that the configuration of the fourth embodiment is equal to one obtained by forming the "lower semiconductor element layer" directly on the base 10, and by additionally forming the "upper wiring layer" over the "lower semiconductor element layer" by way of the "lower wiring layer" and the "upper semiconductor element layer". Needless to say, the "upper semiconductor element layer" and the "lower semiconductor element layer" can be electrically connected to each other as necessary.

Furthermore, in FIG. 13, the "upper semiconductor element layer" and the "lower semiconductor element layer" are directly adhered to each other by way of the adhesive film 13'. However, the invention is not limited to this. For example, a low dielectric constant material film may be additionally formed on the side of the "upper semiconductor element layer" or the "lower semiconductor element layer" and thereafter, the "upper semiconductor element layer" and the "lower semiconductor element layer" may be adhered to each other by way of the additional low dielectric constant material film and the adhesive film 13'. In this case, it goes without saying that the adhesive film 13' may be omitted if the low dielectric constant material film has an adhesion capability.

In this way, with the semiconductor device according to the invention, it is sufficient that a "semiconductor element layer" is formed directly on the base 10 or over the base 10 by way of another layer, and a "wiring layer" is formed directly on the "semiconductor element layer" or over the "semiconductor element layer" by way of another layer.

Fifth Embodiment

The semiconductor element layer in which the MOS transistor is formed is adhered to the base 10 in such a way as to be turned upside down (i.e., the gate electrode of the MOS transistor is directed downward) in the above-described first to fourth embodiments. However, the invention is not limited to this. The semiconductor element layer including the MOS transistor may be adhered to the base 10 without turning upside down (i.e., in such a way that the gate electrode of the MOS transistor is directed upward). An example of this configuration is shown in FIG. 14.

Figure 14:
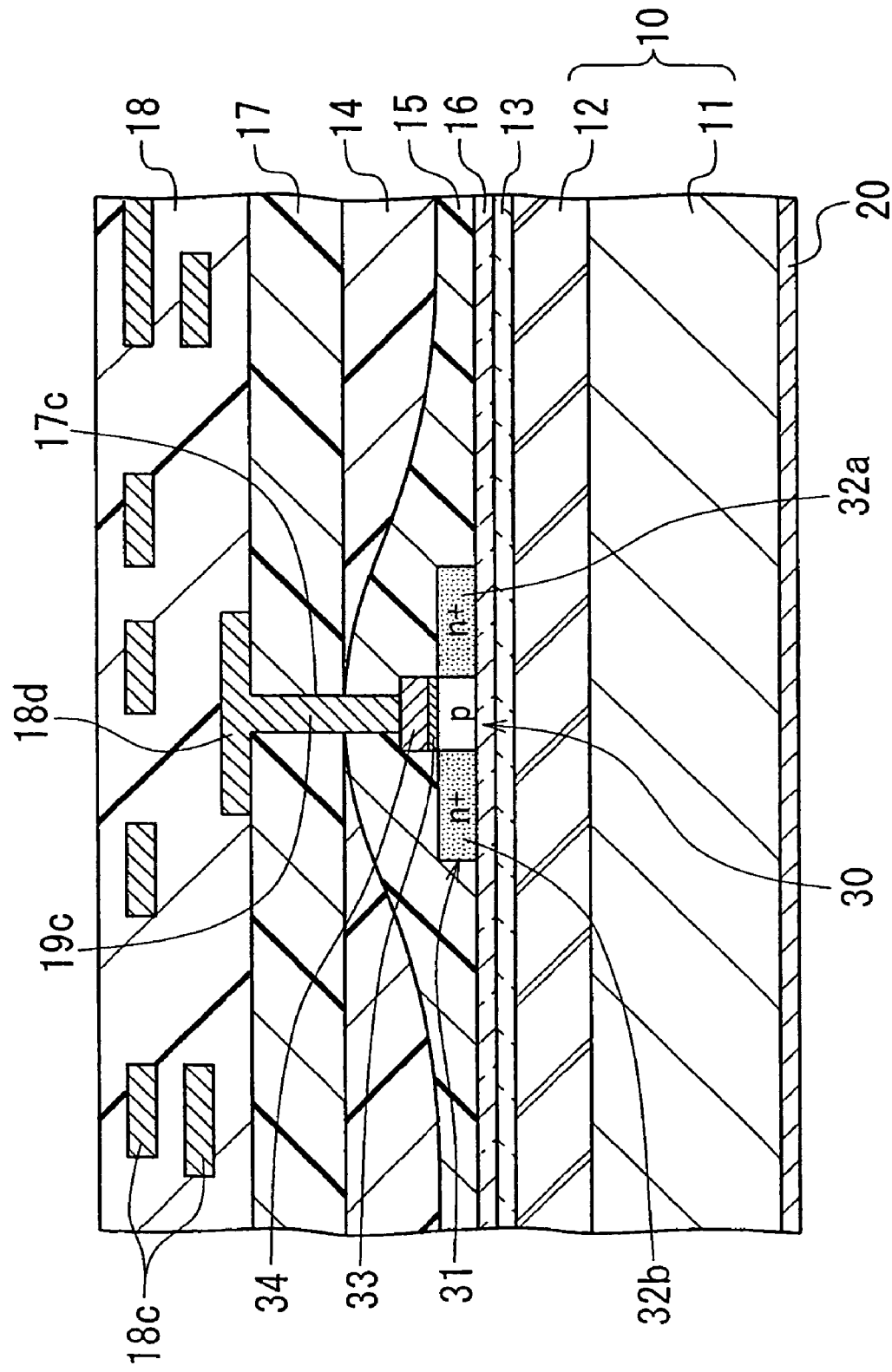
FIG. 14 is a schematic cross-sectional view of a main part of a semiconductor device according to a fifth embodiment of the invention, which shows the configuration thereof.

FIG. 14 is a cross-sectional view showing the configuration of a main part of a semiconductor device according to a fifth embodiment of the invention. This device corresponds to one obtained by placing the semiconductor element layer on the base 10 in such a way that the gate of the MOS transistor is directed upward in the semiconductor device according to the third embodiment (see FIG. 12) which does not include the second gate electrode. Therefore, by attaching the same reference symbols as used for the device of the third embodiment to the same or corresponding elements in FIG. 14, detailed explanation about them is omitted here.

The device of the fifth embodiment is fabricated through substantially the same process steps as those in the third embodiment except for the step of forming the semiconductor element layer and the step of adhering the semiconductor element layer to the base 10. Therefore, the fabrication method of the fifth embodiment will be explained below with reference to FIGS. 15 and 16, where description is centered on the different points.

First, the structure shown in FIG. 2 is formed by a known method. Then, the supporting substrate 42 is adhered to the planarized surface of the interlayer insulator film 14. As the supporting substrate 42, a plate made of any material (e.g., Si, quartz or the like) may be used if it supports the structure of FIG. 2. The state at this stage is shown in FIG. 15.

Next, the whole Si substrate 41 is removed by a known polishing or etching method while holding the combination of the structure of FIG. 2 and the film 14 by using the supporting substrate 42, thereby exposing the insulator film 16. Thus, the Si substrate 41 is a "sacrificial substrate" in the method of fabricating the device according to the fifth embodiment as well.

On the other hand, similar to the way used in the first embodiment, the base 10 comprising the substrate 11 and the low dielectric constant material film 12 is formed, and the adhesive film 13 is formed on the surface of the film 12 by coating (See FIG. 3).

Figure 15:
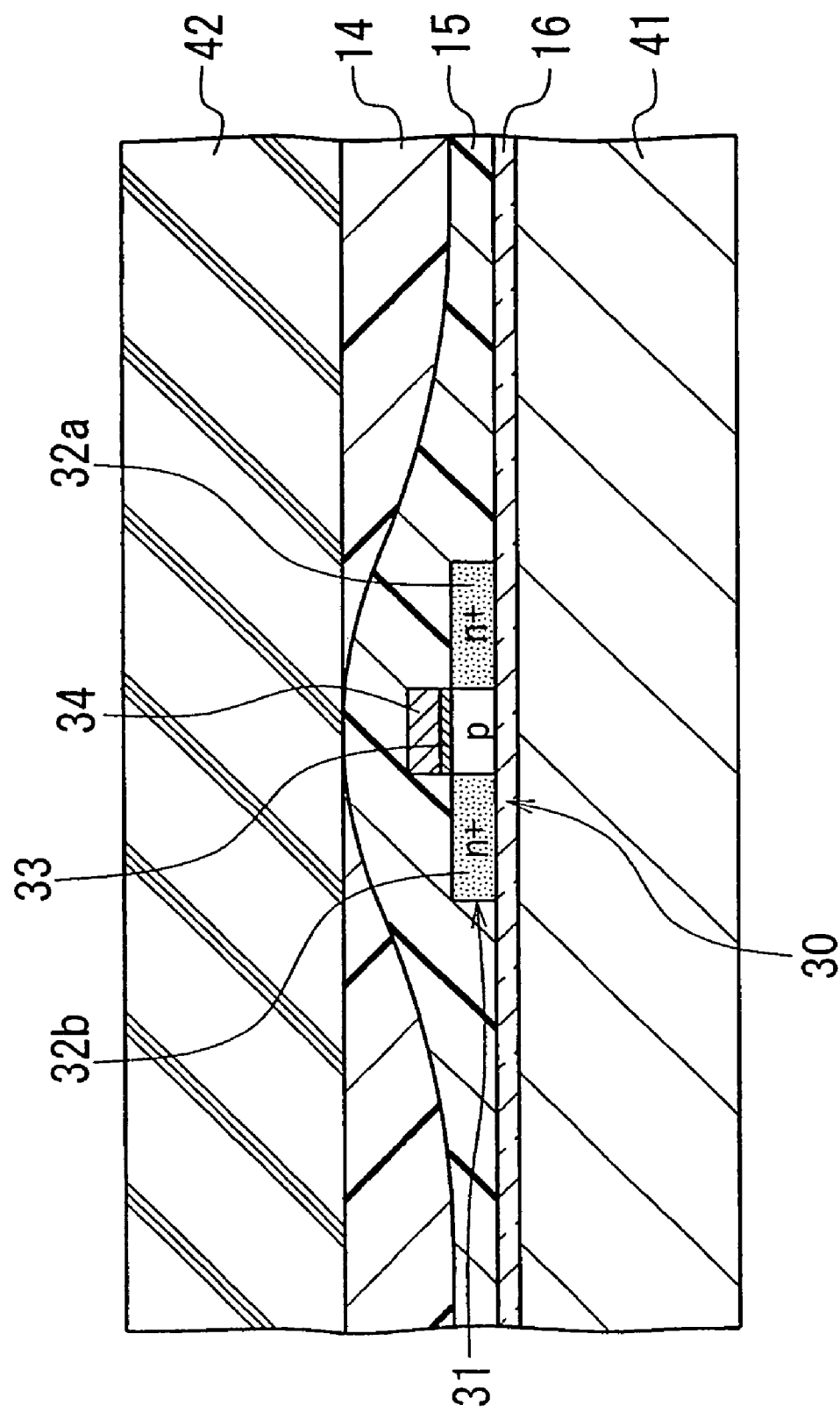
FIG. 15 is a view showing the process steps of a method of fabricating the semiconductor device according to the fifth embodiment of FIG. 14.
Figure 16:
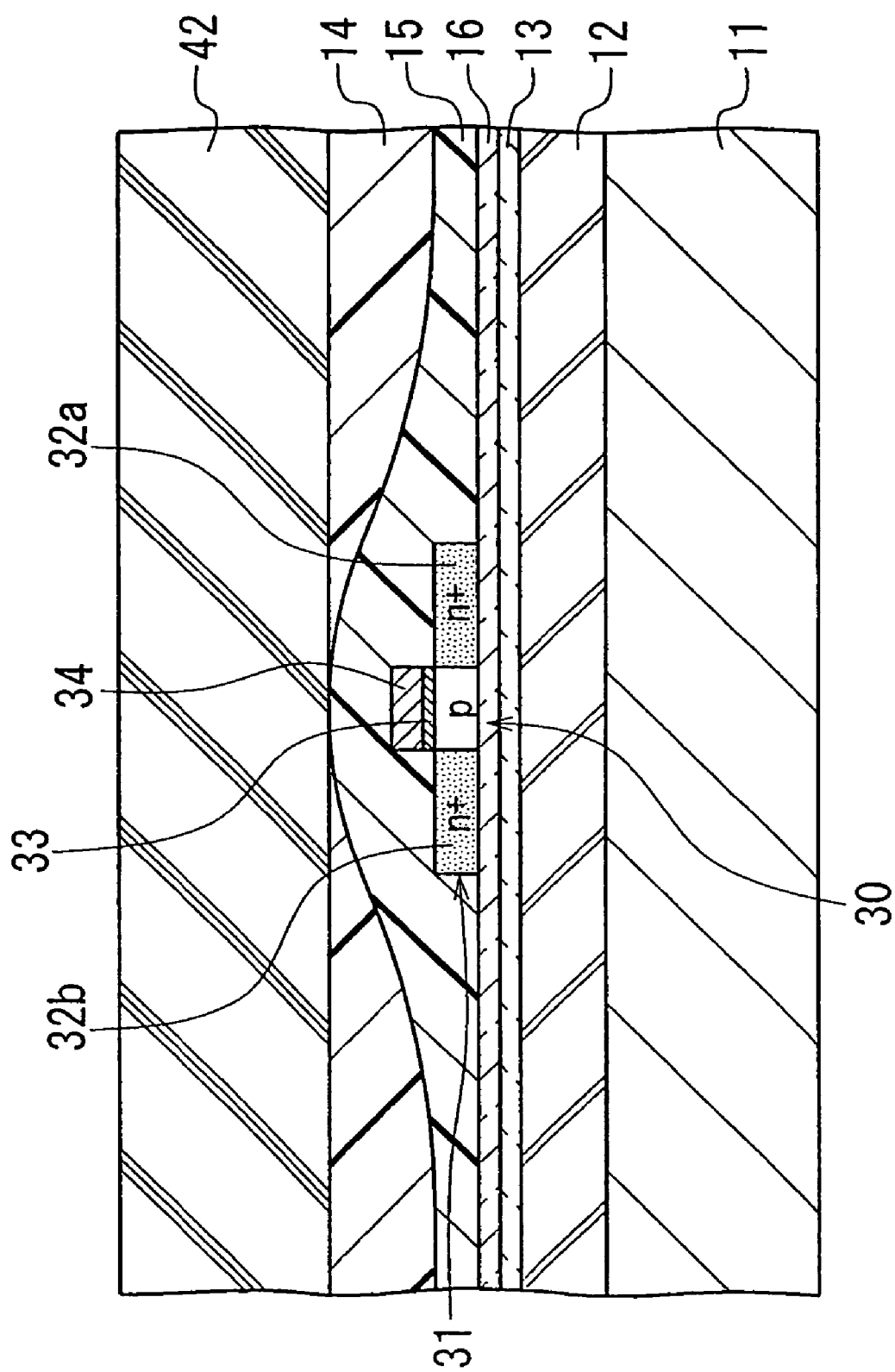
FIG. 16 is a view showing the process steps of the method of fabricating the semiconductor device according to fifth second embodiment of FIG. 14, which is subsequent to the step of FIG. 15.

Subsequently, the structure obtained by removing the Si substrate 41 from the structure of FIG. 15 is joined to the structure of FIG. 3 while making their positional alignment, thereby unifying them, as shown in FIG. 16. In other words, the exposed surface of the insulator film 16 and the flat surface of the low dielectric constant material film 12 of the base 10 are opposed and joined to each other. In this state, a predetermined curing treatment is applied to the adhesive film 13, where the adhesive film 13 is cured and thus, the semiconductor element layer is adhered onto the base 10. At this time, the substrate 11 is located in the lowest level while the supporting substrate 42 is located in the highest level. The orientation of the MOS transistor 30 is not reversed, i.e., the gate electrode 34 thereof is located on the upper side. The state at this stage is shown in FIG. 16.

Next, the supporting substrate 42, which is located in the highest level, is entirely removed by polishing or etching, thereby exposing the interlayer insulator film 14. After the insulator film 17 is formed on the interlayer insulator film 14, the contact hole 17*c* penetrating through the insulator film 17 and the interlayer insulator films 14 and 15 is formed by etching, thereby exposing the gate electrode 34.

Next, a conductive film (not shown) with such a thickness as to fill the contact hole 17*c* is formed on the insulator film 17 and thereafter, an etch back or CMP method is applied to the conductive film, thereby selectively removing the conductive film at the location other than the hole 17*c*. Thus, as shown in FIG. 14, the contact plug 19*c* is formed in the hole 17*c* by the remaining conductive film. As the conductive film, for example, a film made of W, Al, Cu or the like may be used.

Thereafter, the multilayer wiring structure 18 including the metal wiring 18*c* and the wiring electrode 18*d* connected to the contact plug 19*c* is formed on the insulator film 17 by a known method.

Finally, a metal film made of copper, aluminum or the like is formed on the whole lower surface of the substrate 11 by an evaporation or plating method, resulting in the lower electrode 20. In this way, the semiconductor device according to the fifth embodiment as shown in FIG. 14 is obtained.

Additionally, the lower electrode 20 may be formed on the back surface of the substrate 11 beforehand at the time when the base 10 is formed by the substrate 11 and the low dielectric constant material film 12, as shown in FIG. 3. This is the same as the third embodiment.

As explained above, the semiconductor device according to the fifth embodiment has substantially the same configuration as the device according to the third embodiment. Therefore, it is apparent that the same advantages as those in the third embodiment are obtained.

In the fifth embodiment, needless to say, the second gate electrode may be additionally formed as necessary. This is easily realizable by, for example, the fabrication method as explained above with reference to FIGS. 15 and 16, if the step of forming the second gate electrode 35 on the insulator film 16 is added after the Si substrate 41 is removed from the structure of FIG. 15.

Sixth Embodiment

Figure 17:
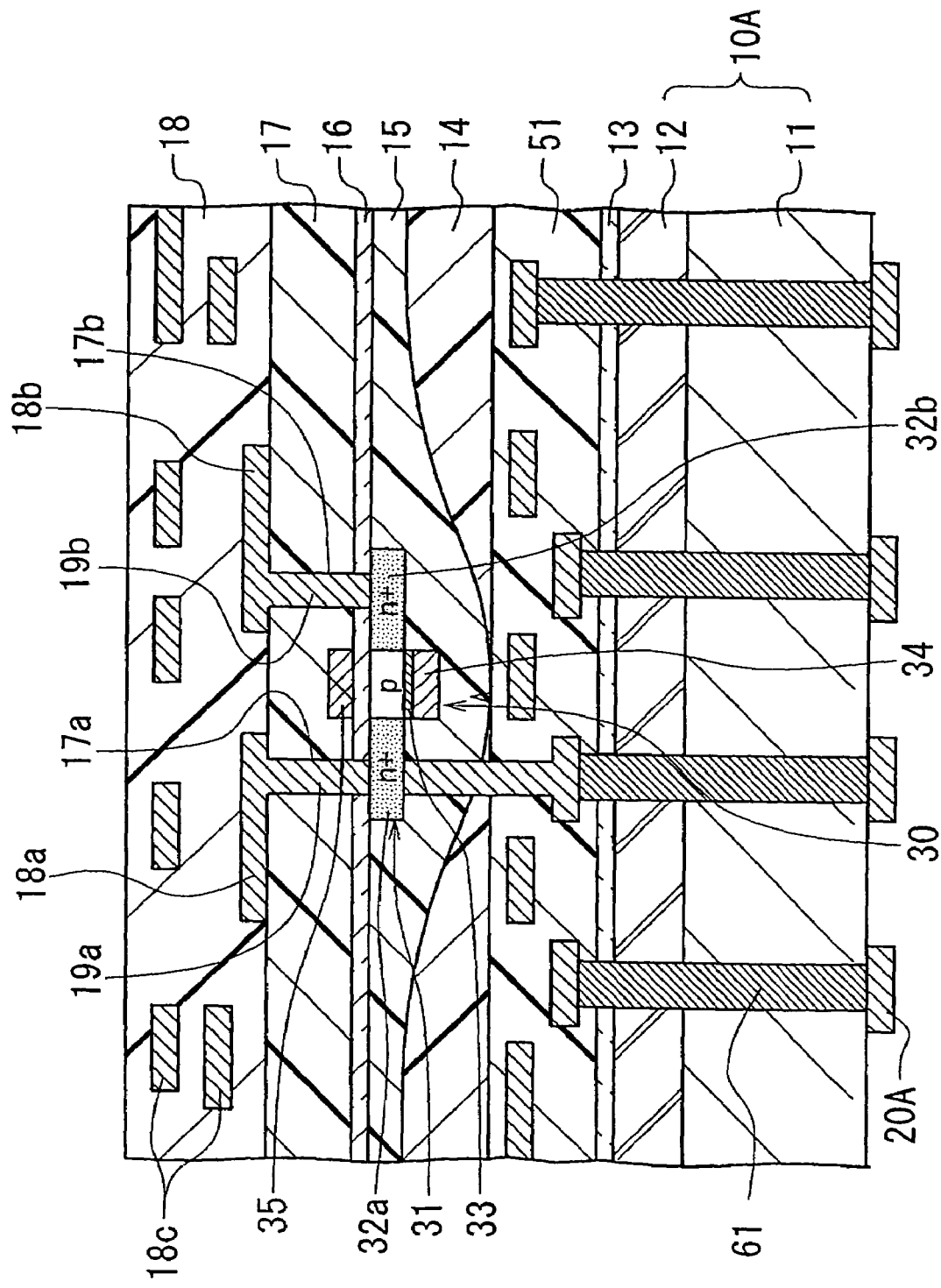
FIG. 17 is a schematic cross-sectional view of a main part of a semiconductor device according to a sixth embodiment of the invention, which shows the configuration thereof.

FIG. 17 is a cross-sectional view showing the configuration of a main part of a semiconductor device according to a sixth embodiment of the invention.

The device of FIG. 17 corresponds to one obtained by providing a base 10A having the function of interposer instead of the base 10 in the semiconductor device according to the second embodiment. Therefore, by attaching the same reference symbols as used for the device of the second embodiment to the same or corresponding elements in FIG. 17, detailed explanation about them is omitted here.

The device of the sixth embodiment comprises buried interconnections 61 penetrating through the substrate 11 and the low dielectric constant material film 12 that constitute the base 10A, as shown in FIG. 17. The upper ends of the interconnections 61 are contacted with the corresponding wiring provided in the multilayer wiring structure 51. The lower ends of the interconnections 61 are contacted with the corresponding lower electrodes 20A. As a result, the base 10A and the lower electrodes 20A provide the function of "interposer".

The device of the sixth embodiment having the above-described configuration is fabricated in the same way as the second embodiment.

Specifically, as shown in FIG. 10 (which corresponds to FIG. 2), the MOS transistor 30 is formed on the insulator film 16 located on the Si substrate 41 in the same way as described in the first embodiment. Thereafter, the interlayer insulator film 15 is formed on the insulator film 16 to cover the whole transistor 30 and then, the interlayer insulator film 14 is formed on the film 15.

Subsequently, on the planarized surface of the film 14, the multilayer wiring structure 51 is formed by a known method. At this time, the source/drain regions 32a and 32b of the transistor 30 are electrically connected to the predetermined wiring in the wiring structure 51 by way of the corresponding contact plugs filled in the contact holes penetrating through the interlayer insulator films 14 and 15. Since this method is the same as that for the multilayer wiring structure 18, explanation about it is omitted. Finally, the surface of the wiring structure 51 is planarized by a CMP or etching method.

On the other hand, as shown in FIG. 3, the base 10A comprising by the substrate 11 and the low dielectric constant material film 12 is formed and thereafter, the surface of the film 12 is planarized. On the film 12, an appropriate adhesive is coated to form the adhesive film 13.

Figure 18:
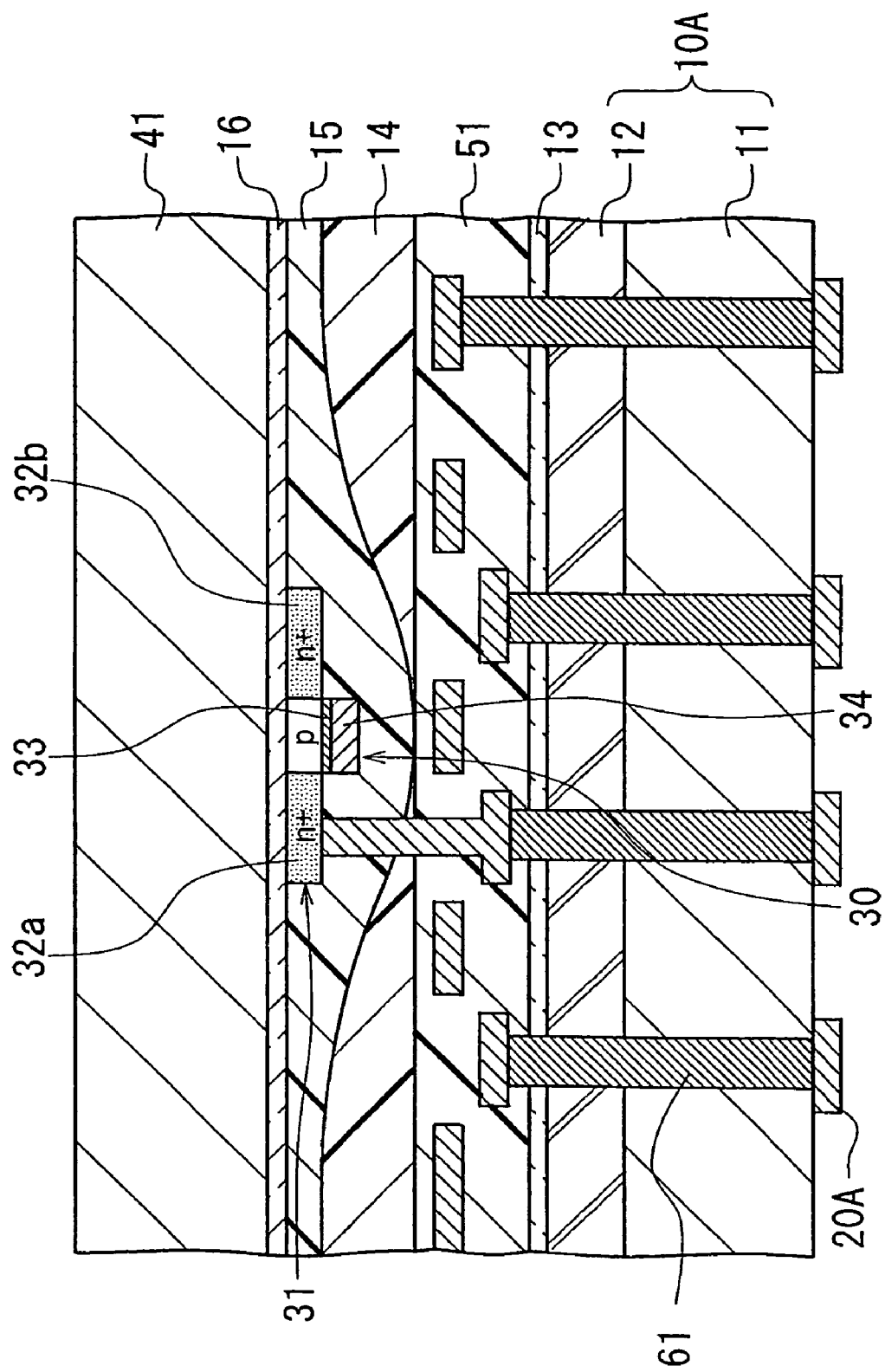
FIG. 18 is a view showing the process steps of a method of fabricating the semiconductor device according to the sixth embodiment of FIG. 17.

Following this, the structure of FIG. 10 is turned upside down and then, it is joined to the structure of FIG. 3 while making their positional alignment, thereby unifying them, as shown in FIG. 18. In other words, the planarized surface of the wiring structure 51 and the flat surface of the low dielectric constant material film 12 are opposed and joined to each other. In this state, a predetermined curing treatment is applied to the adhesive film 13, where the film 13 is cured and thus, the semiconductor element layer is joined to the base 10. At this time, the substrate 11 is located in the lowest level while the Si substrate 41 is located in the highest level. The MOS transistor 30 is reversed.

Subsequently, holes penetrating through the base 10A are formed by an etching method and then, a conductive material such as tungsten (W) is filled into the holes, forming the buried interconnections 61. The upper ends of the respective interconnections 61 are contacted with the corresponding wiring in the wiring structure 51. The lower ends of the interconnections 61 are exposed from the lower surface of the substrate 11.

A metal film made of copper, aluminum or the like is formed on the part or whole of the lower surface of the substrate 11 by an evaporation or plating method and patterned, whereby forming the lower electrodes 20A. The lower ends of the interconnections 61 are contacted with the corresponding electrodes 20A. The state at this stage is shown in FIG. 18.

Next, the Si substrate 41, which is located in the highest level, is entirely removed by etching, exposing the insulator film 16. Similar to the first embodiment, the second gate electrode 35 is formed on the insulator film 16 and then, the insulator film 17 is formed on the film 16. Thereafter, the contact holes 17a and 17b and the contact plugs 19a and 19b are respectively formed by the same method as the first embodiment. In this way, the semiconductor device with the configuration of FIG. 17 is obtained.

As explained above, the semiconductor device according to the sixth embodiment has substantially the same configuration as the device according to the first embodiment. Therefore, the same advantages as those in the first embodiment are obtained. Moreover, the base 10A and the lower electrodes 20A have the function of "interposer" and therefore, there is an advantage that the electric signals can be easily derived from the inside of the said semiconductor device.

Variations

The above-described first to sixth embodiments are preferred examples of the present invention. It goes without saying that the invention is not limited to these embodiments and that various modifications are possible.

For example, the base 10 has a two-layer structure comprising the substrate 11 and the low dielectric constant material film 12 in the first to sixth embodiments; however, the invention is not limited to this. The base 10 may be formed by only the film 12. Moreover, although one MOS transistor 30 is formed in the semiconductor element layer, it is needless to say that a plurality of MOS transistors may be formed as necessary, any other semiconductor element or elements may be included instead of the MOS transistor or transistors, and various types of semiconductor elements may be mixed together.

As explained above, with the semiconductor device and the fabrication method thereof according to the invention, it is easy to cope with the operating frequency in the order of GHz at a reasonable cost without restriction on the integration scale. It is possible to cope with the operating frequency in the order of GHz using a base with a low dielectric constant material film having a lower relative dielectric constant than silicon. Moreover, it is possible to cope with a situation where the wavelength of signals to be processed is close to the wiring length according to the expansion of the semiconductor device (chip) size and the speedup of the operation thereof.

The invention claimed is:
1. A semiconductor device comprising:
  (a) a base having a first surface and a second surface located on an opposite side to the first surface;
    the base including a low dielectric constant material film whose relative dielectric constant is lower than silicon;
  (b) a first semiconductor element layer including a semiconductor element and an insulator film burying the semiconductor element;
    the first semiconductor element layer being formed on or over the first surface of the base directly or by way of another layer;
  (c) a first wiring layer formed on or over the first semiconductor element layer directly or by way of another layer; and
  (d) an electrode formed on the second surface of the base;
    the electrode forming a return path for a signal transmitted through the first wiring layer;
    wherein the base, the first semiconductor element layer, and the first wiring layer constitute a three-dimensional stacked structure; and
    the semiconductor element of the first semiconductor element layer is formed by using an island-shaped semiconductor film, where the semiconductor film has a limited dimension that realizes a necessary characteristic of the semiconductor element.

2. A device according to claim 1, wherein the base includes a substrate made of insulator, semiconductor, or metal that does not hinder a characteristic of low dielectric constant of the low dielectric constant material film; and
  the low dielectric constant material film is formed on the substrate.

3. A device according to claim 1, wherein the base is formed by only the low dielectric constant material film.

4. A device according to claim 1, wherein the insulator film burying the semiconductor element of the first semiconductor element layer is located opposite to the first surface of the base.

5. A device according to claim 1, wherein an opposite surface of the first semiconductor element layer to the insulator film burying the semiconductor element is located opposite to the first surface of the base.

6. A device according to claim 1, further comprising a second semiconductor element layer or a second wiring layer between the first surface of the base and the first semiconductor element layer; and the first semiconductor element layer is formed over the first surface of the base by way of the second semiconductor element layer or the second wiring layer.

7. A device according to claim 1, further comprising a second semiconductor element layer or a second wiring layer between the first semiconductor element layer and the first wiring layer; and the first wiring layer is formed over the first semiconductor element layer by way of the second semiconductor element layer or the second wiring layer.

8. A device according to claim 1, wherein the semiconductor element of the first semiconductor element layer is a field-effect transistor formed in the island-shaped semiconductor film; and the transistor comprises a first gate electrode formed on one side of the semiconductor film and a second gate electrode formed on an opposite side of the semiconductor film to the first gate electrode.

9. A device according to claim 8, wherein the first gate electrode of the field-effect transistor is located on a side of the base with respect to the island-shaped semiconductor film.

10. A device according to claim 1, wherein the semiconductor element of the first semiconductor element layer is a field-effect transistor formed in the island-shaped semiconductor film; and the transistor comprises a first gate electrode formed on one side of the semiconductor film.

11. A device according to claim 10, wherein the first gate electrode of the field-effect transistor is located on a side of the base with respect to the island-shaped semiconductor film.

12. A semiconductor device comprising:

(a) a base having a first surface and a second surface located on an opposite side to the first surface;

the base including a low dielectric constant material film whose relative dielectric constant is lower than silicon;

(b) a first semiconductor element layer including a semiconductor element and an insulator film burying the semiconductor element;

the first semiconductor element layer being formed on or over the first surface of the base directly or by way of another layer;

(c) a first wiring layer formed on or over the first semiconductor element layer directly or by way of another layer; and (d) electrodes formed on the second surface of the base;

(e) buried interconnections formed to penetrate through the base and to be contacted with the respective electrodes;

wherein the base, the first semiconductor element layer, and the first wiring layer constitute a three-dimensional stacked structure; and the semiconductor element of the first semiconductor element layer is formed by using an island-shaped semiconductor film, where the semiconductor film has a limited dimension that realizes a necessary characteristic of the semiconductor element; and the base, the electrodes, and the interconnections have a function of interposer.

13. A device according to claim 12, wherein the base includes a substrate made of insulator, semiconductor, or metal that does not hinder a characteristic of low dielectric constant of the low dielectric constant material film; and the low dielectric constant material film is formed on the substrate.

14. A device according to claim 12, wherein the base is formed by only the low dielectric constant material film.

* * * * *